US012777735B2

(12) United States Patent
Matsuo et al.

(10) Patent No.: US 12,777,735 B2
(45) Date of Patent: Oct. 27, 2026

(54) IMAGING DEVICE

(71) Applicant: Sony Semiconductor Solutions Corporation, Kanagawa (JP)

(72) Inventors: Junichi Matsuo, Osaka (JP); Yusuke Otake, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 334 days.

(21) Appl. No.: 18/702,899

(22) PCT Filed: Oct. 18, 2022

(86) PCT No.: PCT/JP2022/038801
§ 371 (c)(1),
(2) Date: Apr. 19, 2024

(87) PCT Pub. No.: WO2023/105935
PCT Pub. Date: Jun. 15, 2023

(65) Prior Publication Data

US 2025/0176298 A1 May 29, 2025

(30) Foreign Application Priority Data

Dec. 10, 2021 (JP) ................................ 2021-201283

(51) Int. Cl.
*H10F 39/00* (2025.01)

(52) U.S. Cl.
CPC ......... *H10F 39/809* (2025.01); *H10F 39/811* (2025.01)

(58) Field of Classification Search
CPC ....... H10F 39/12; H10F 39/809; H10F 39/811
See application file for complete search history.

(56) References Cited

U.S. PATENT DOCUMENTS

| | | | | |
|---|---|---|---|---|
| 2022/0006968 | A1* | 1/2022 | Yamashita | H10F 39/802 |
| 2022/0384207 | A1* | 12/2022 | Haneda | H10F 39/811 |

FOREIGN PATENT DOCUMENTS

| | | | |
|---|---|---|---|
| JP | 2003204054 | A | 7/2003 |
| JP | 2017046260 | A | 3/2017 |
| JP | 2018064758 | A | 4/2018 |
| JP | 2020088380 | A | 6/2020 |

OTHER PUBLICATIONS

International Search Report (PCT/ISA/210), International Application No. PCT/JP2022/038801, dated Jan. 24, 2023.

* cited by examiner

*Primary Examiner* — Fazli Erdem
(74) *Attorney, Agent, or Firm* — Michael Best & Friedrich LLP

(57) ABSTRACT

In one example, an imaging device includes first junction electrodes on a junction surface of a first substrate with a second substrate and electrically coupled to respective floating diffusion layers; and second junction electrodes on a junction surface of the second substrate with the first substrate and joined to respective ones of the first junction electrodes. The first substrate and the second substrate are stacked, and electric charge temporarily held is read as signal charge at different timings of the respective floating diffusion layers electrically coupled to one of the first and second junction electrodes that are joined to each other and to another adjacent one of the first and second junction electrodes that are joined to each other.

15 Claims, 32 Drawing Sheets

[ FIG. 1 ]
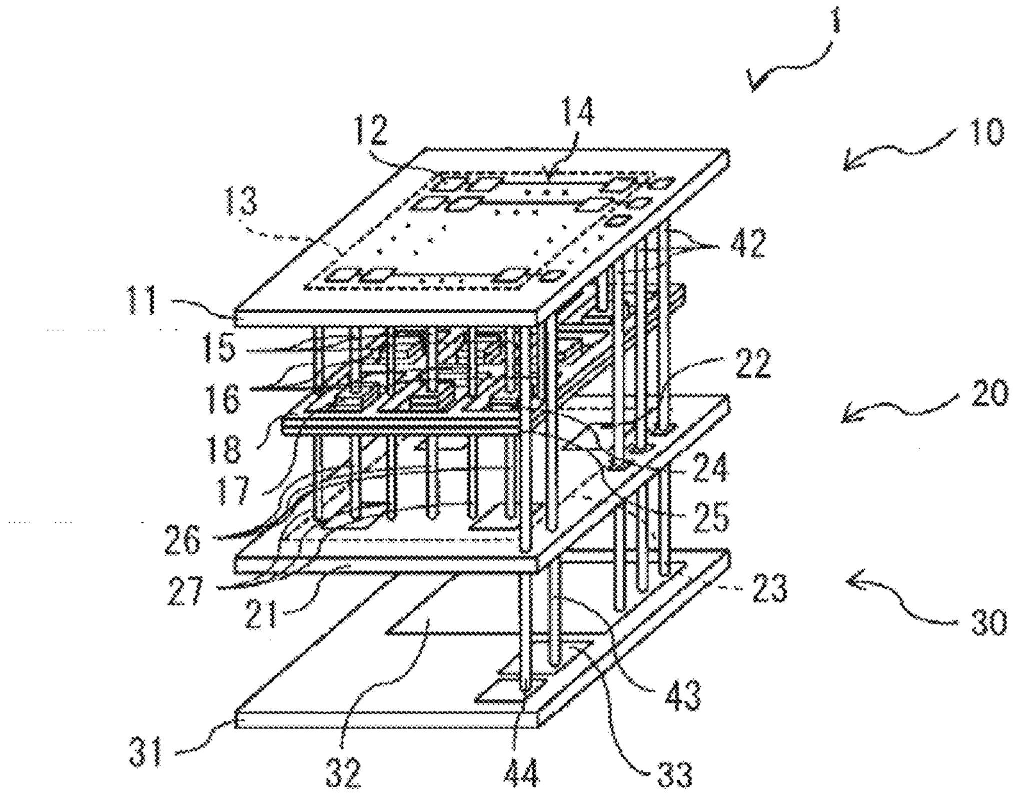
[ FIG. 2 ]
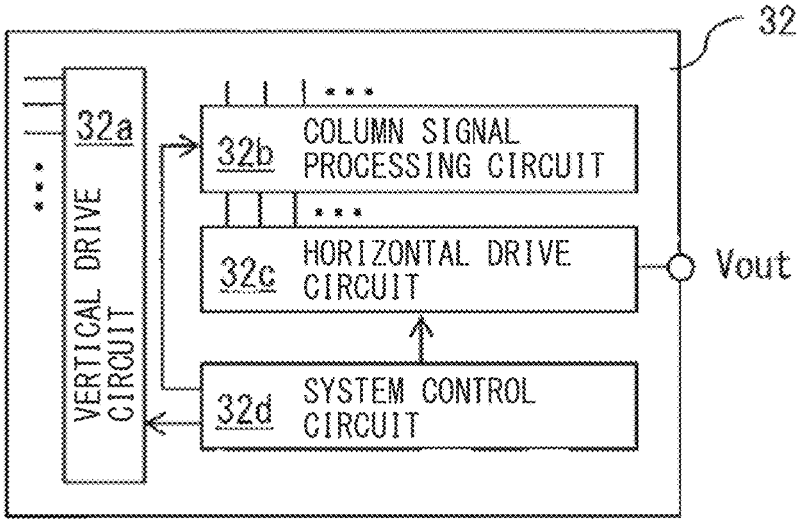

[ FIG. 3 ]
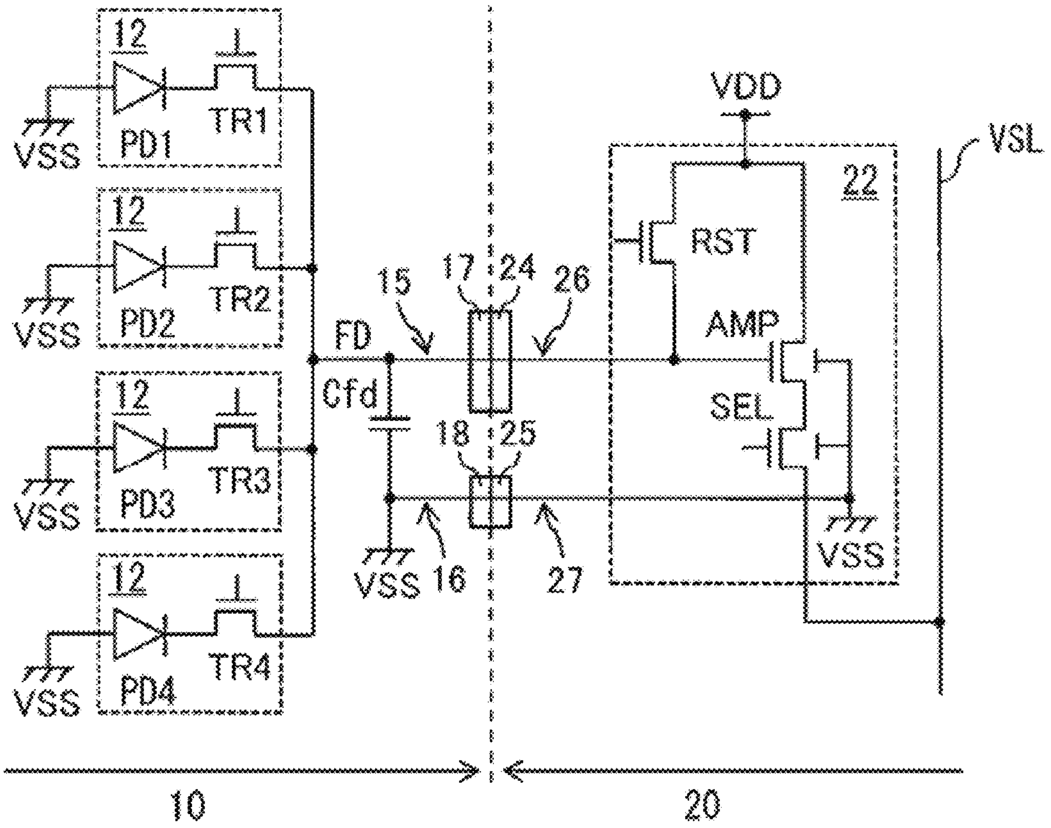
[ FIG. 4 ]
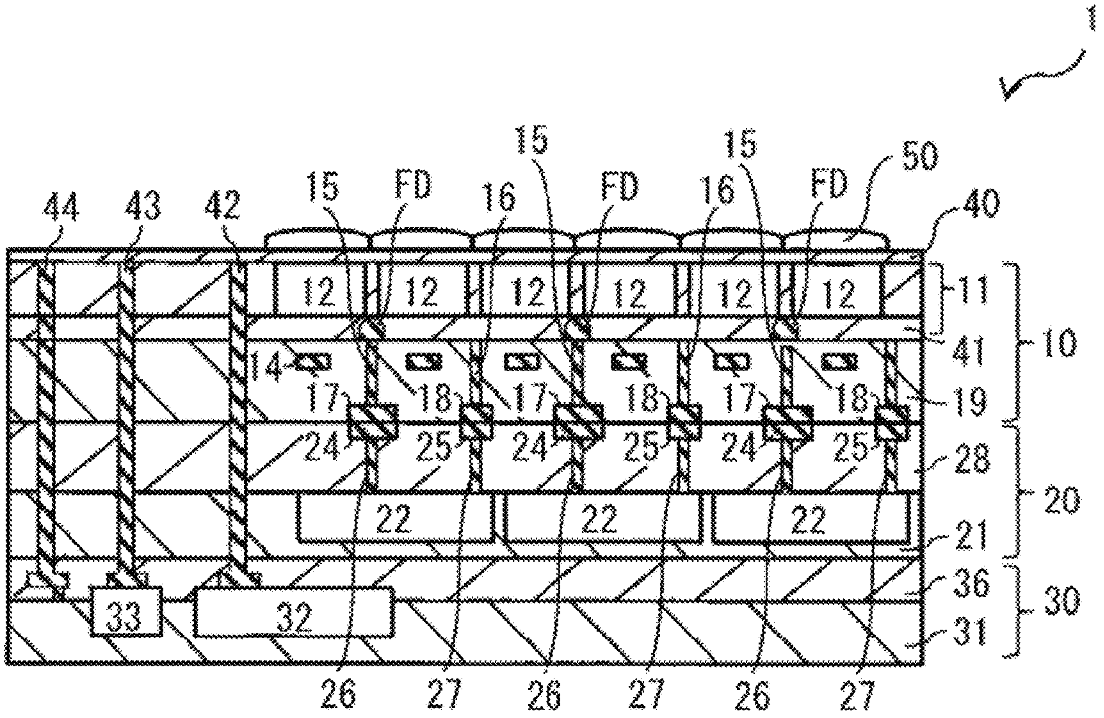

[ FIG. 5 ]
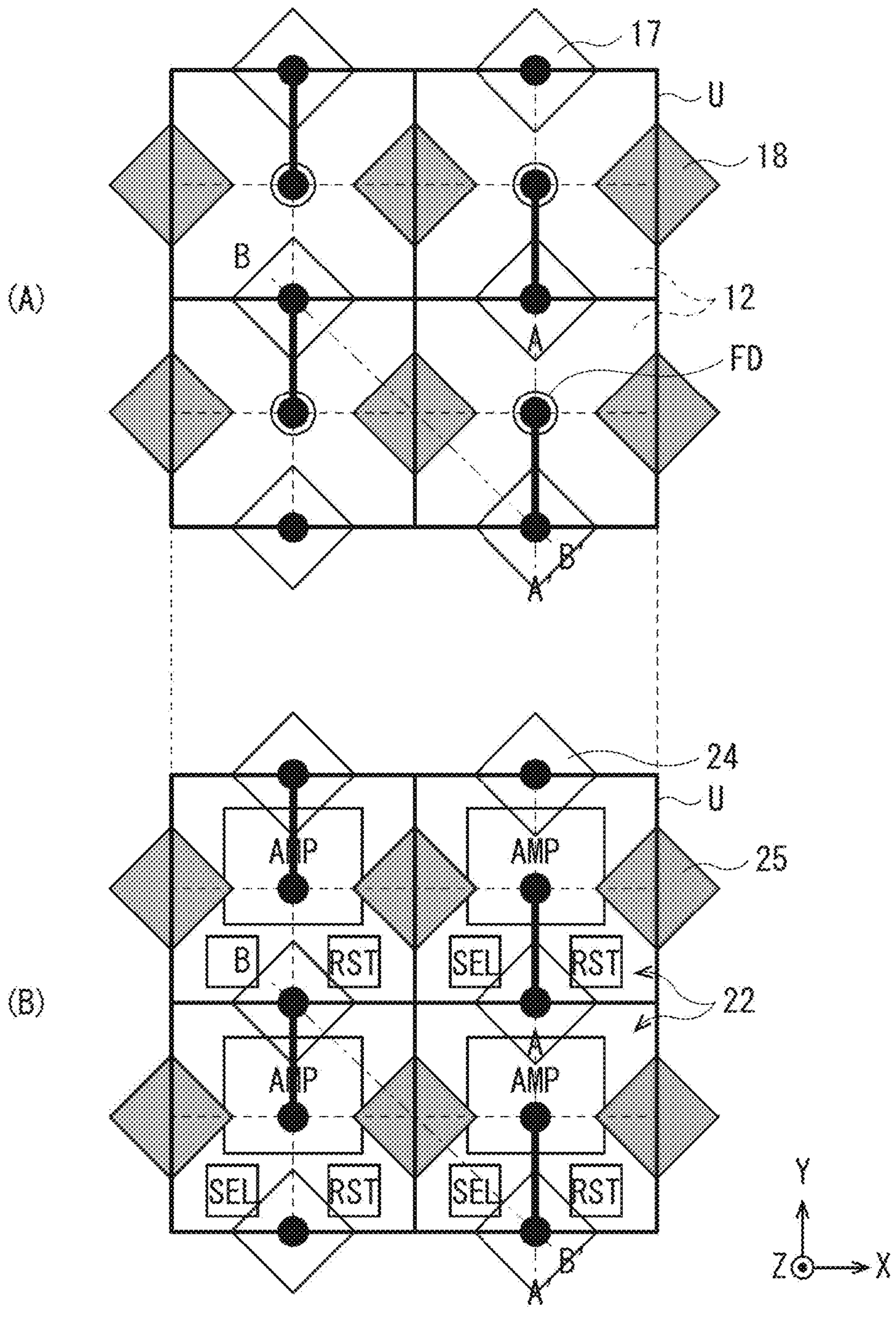

[ FIG. 6 ]
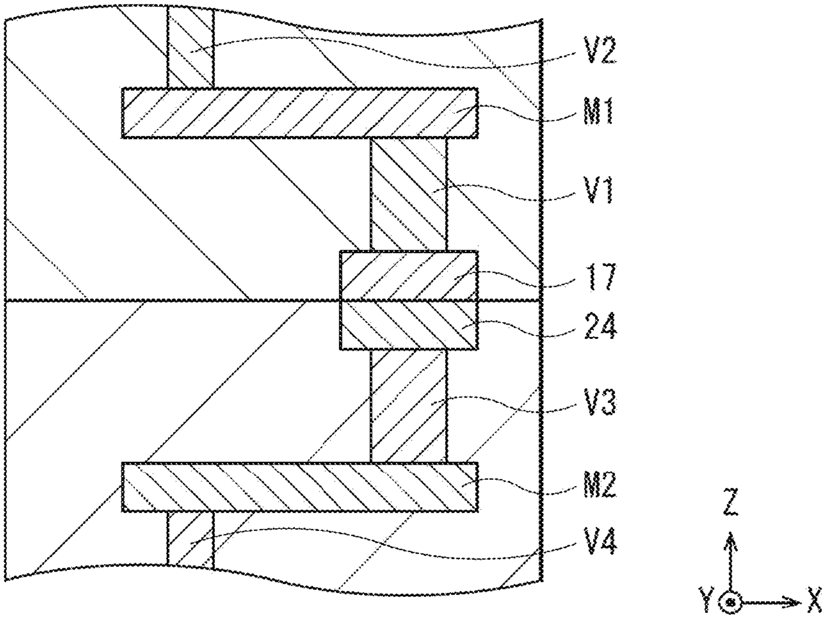
[ FIG. 7 ]
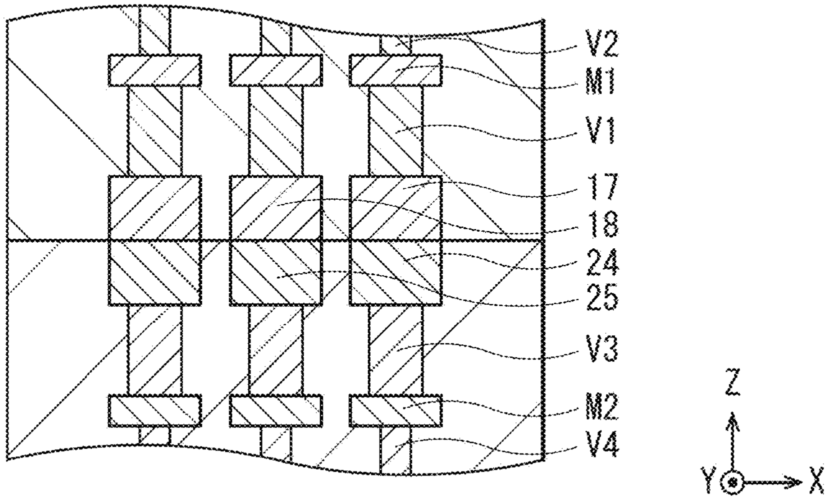

[ FIG. 8 ]
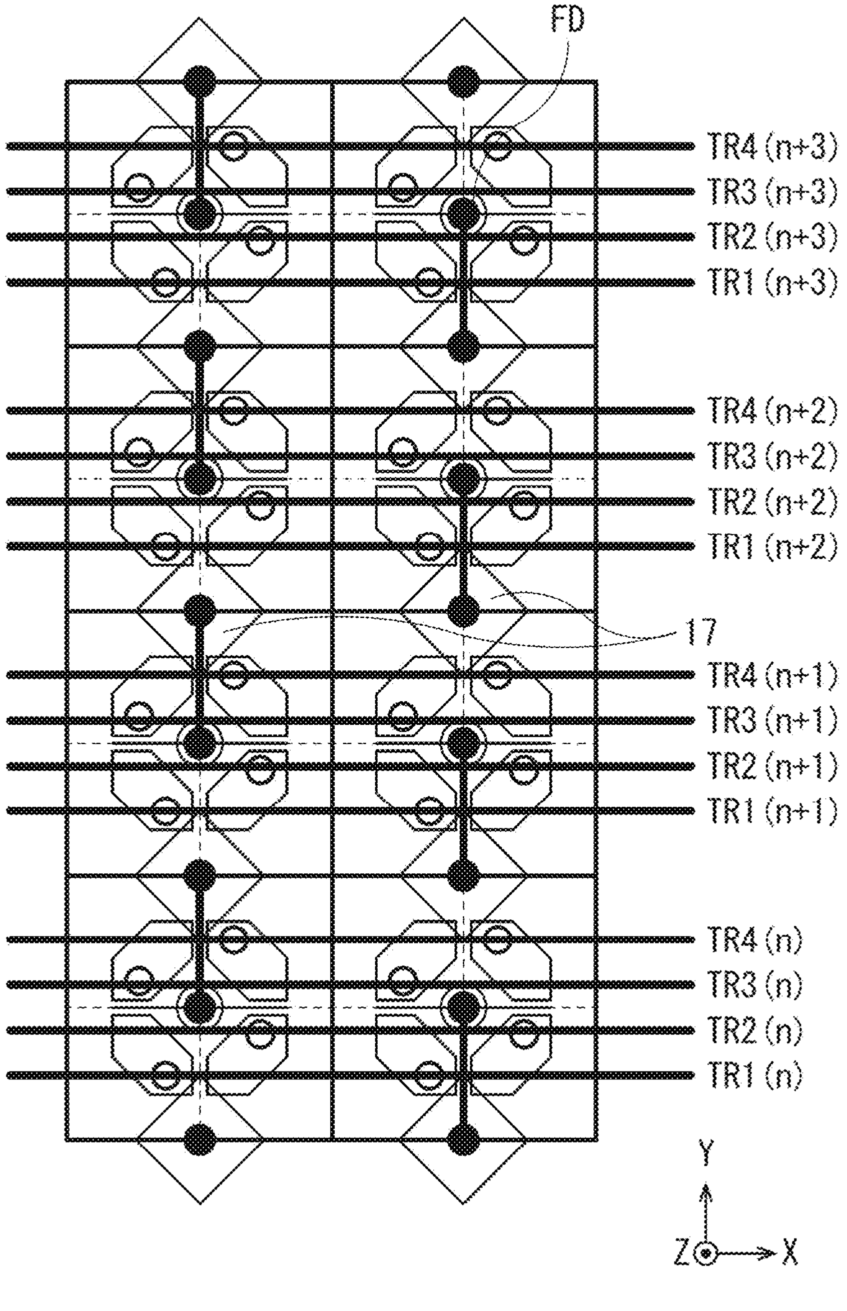

[ FIG. 10A ]
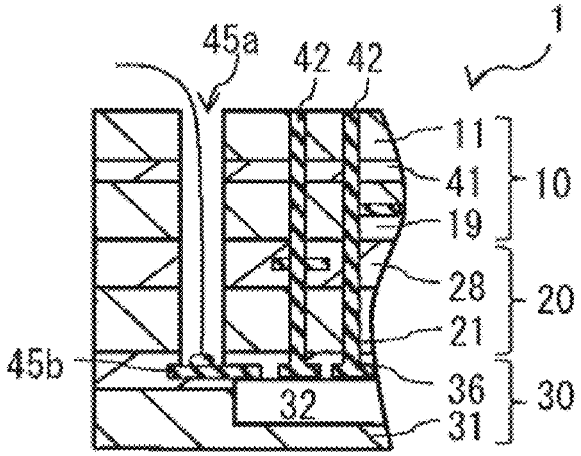
[ FIG. 10B ]
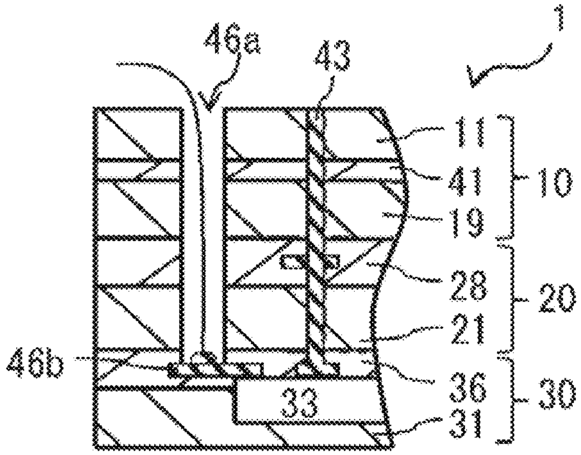
[ FIG. 10C ]
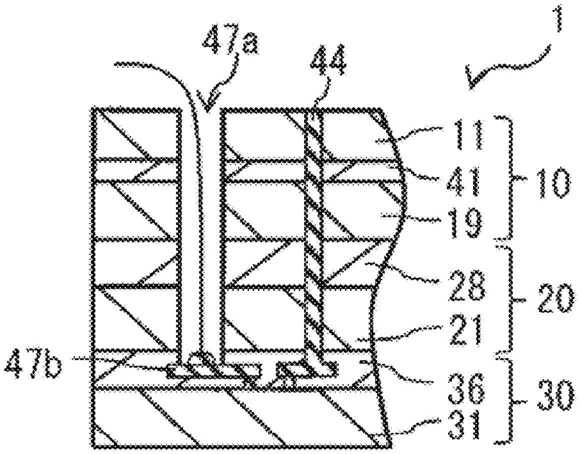

[ FIG. 11A ]
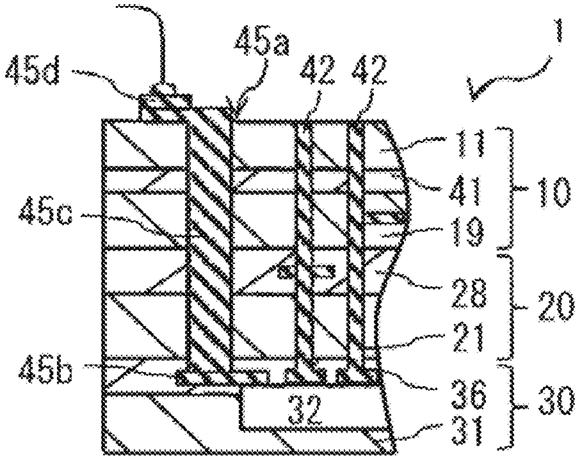
[ FIG. 11B ]
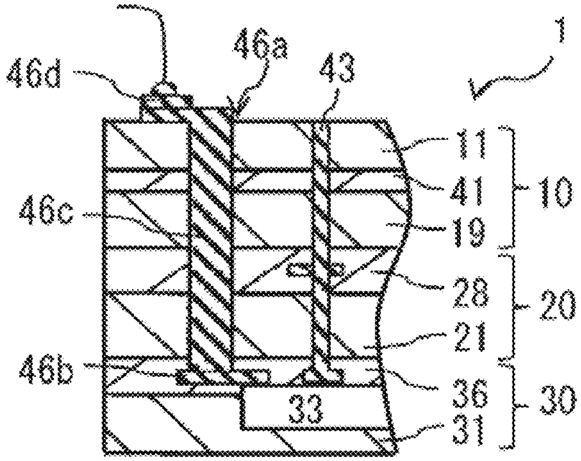
[ FIG. 11C ]
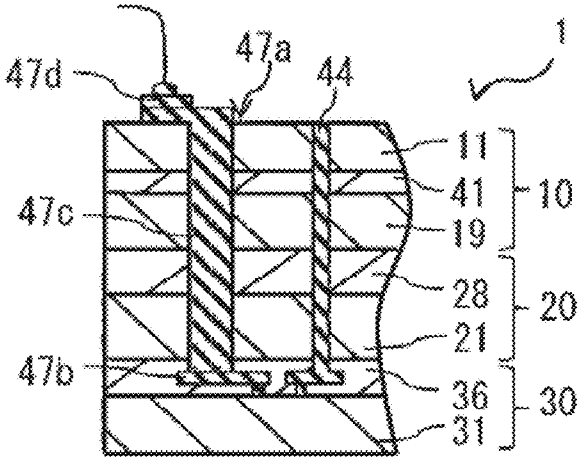

[ FIG. 12 ]
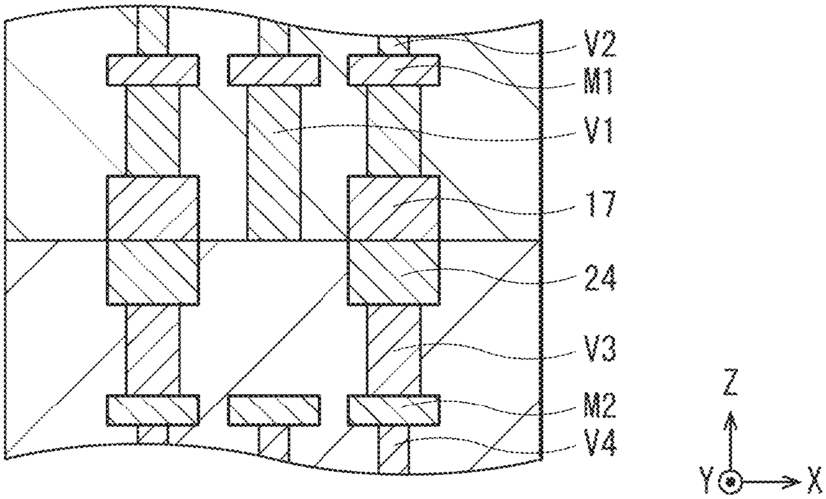
[ FIG. 13 ]
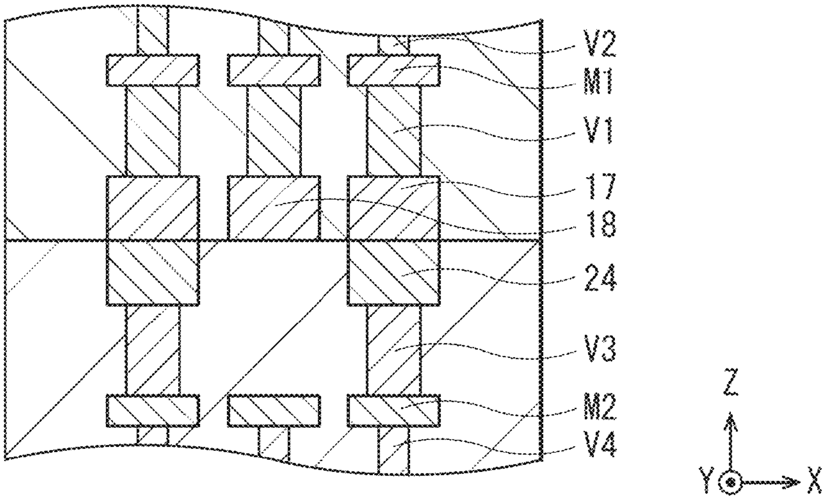

[ FIG. 14 ]
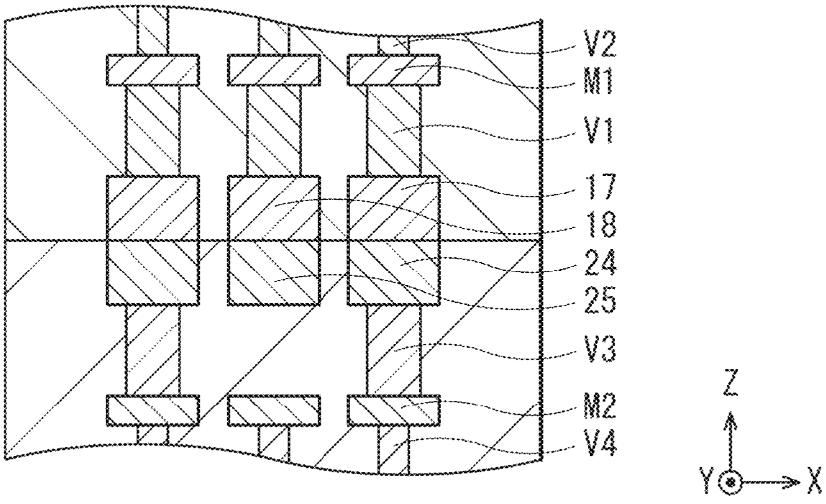

[ FIG. 15 ]
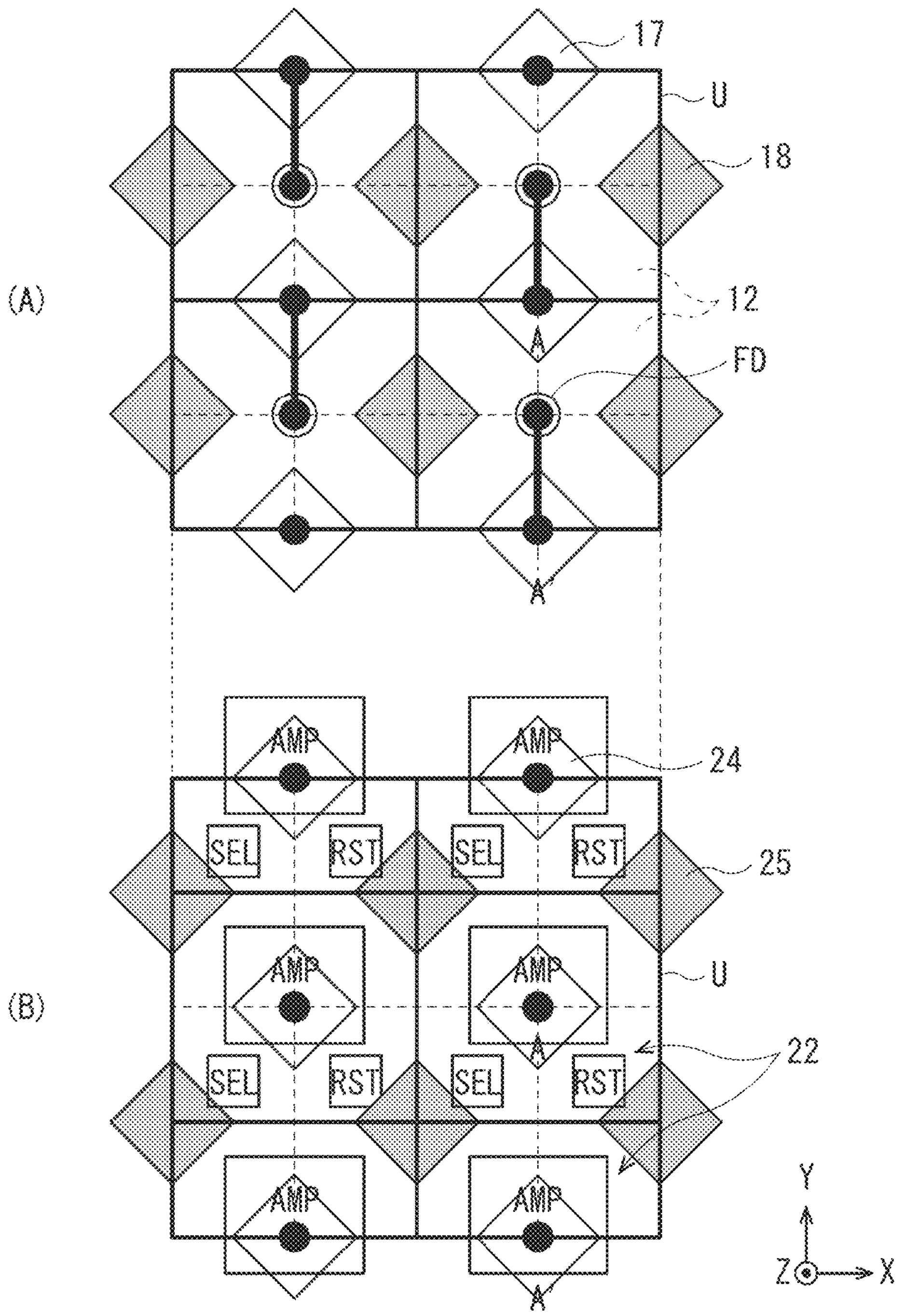

[ FIG. 16 ]
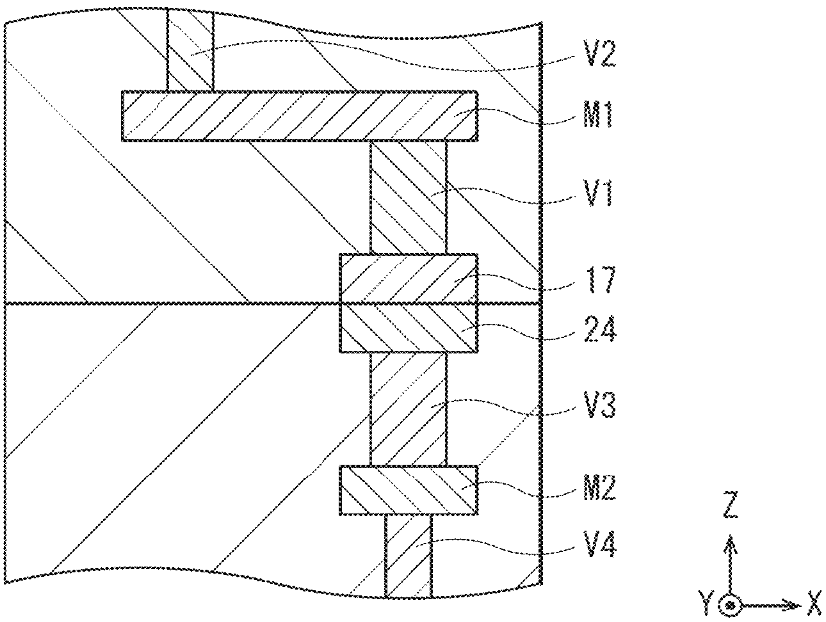

[ FIG. 17 ]
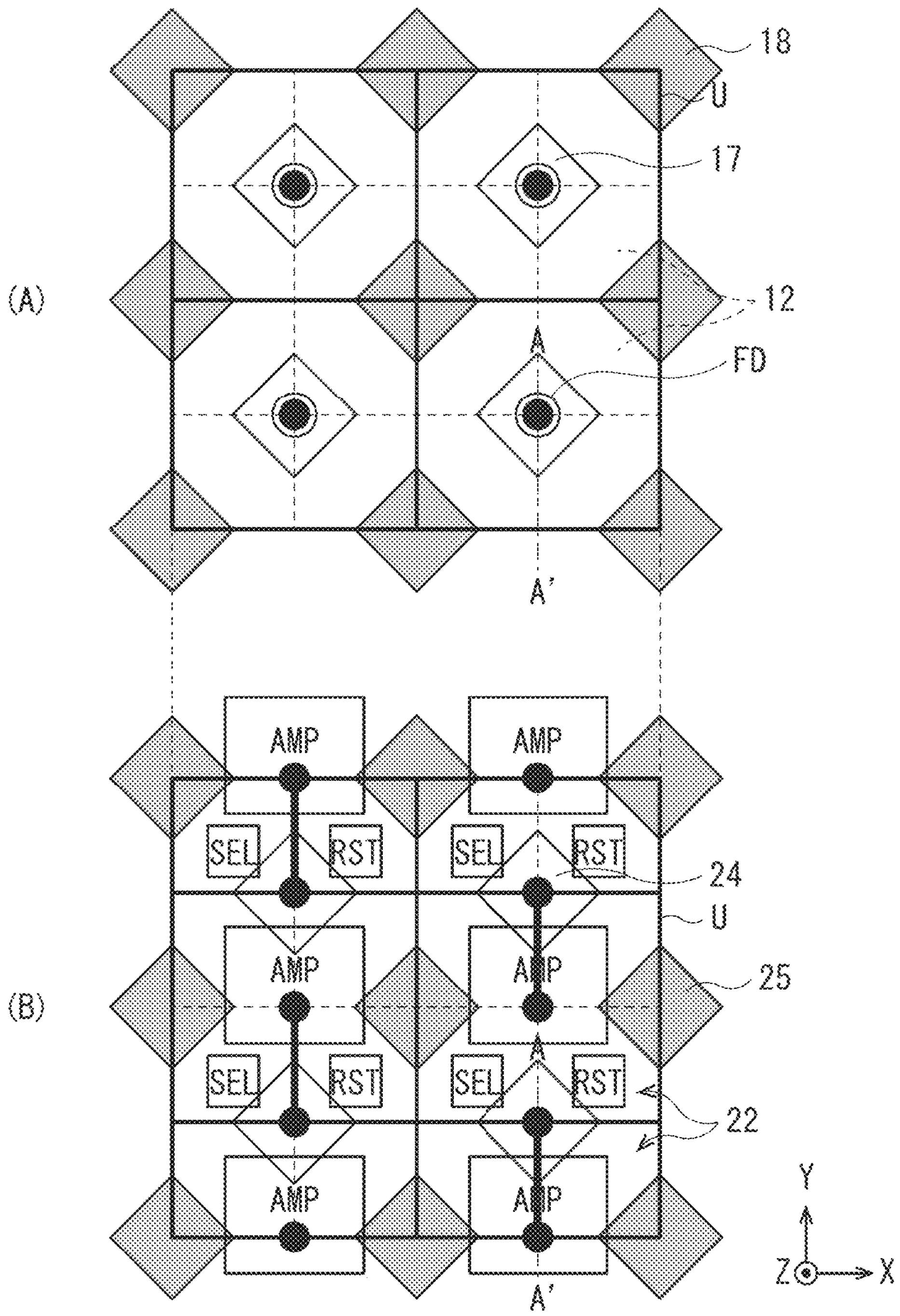

[ FIG. 18 ]
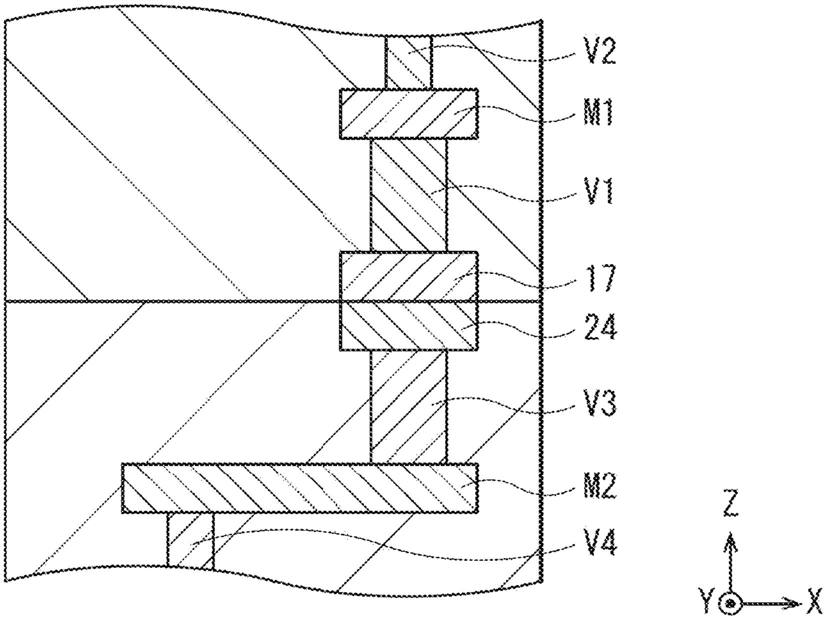
[ FIG. 19 ]
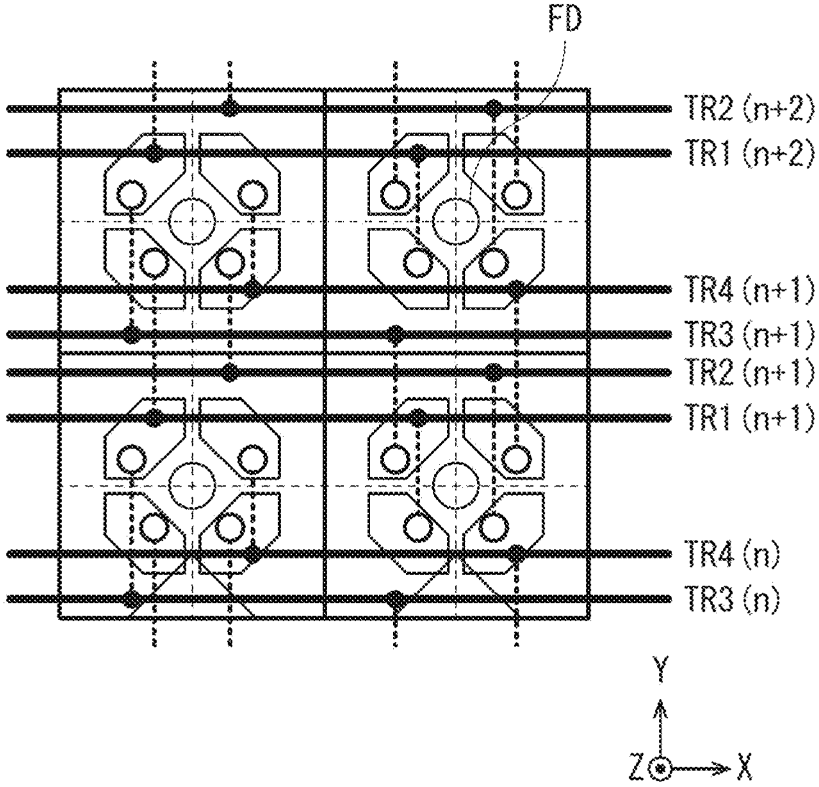

[ FIG. 20 ]
(A)
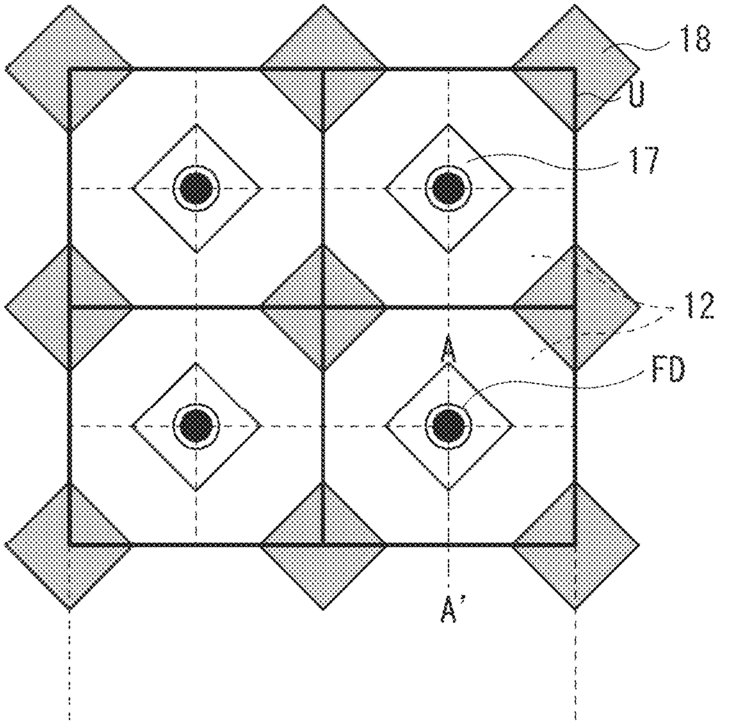
(B)
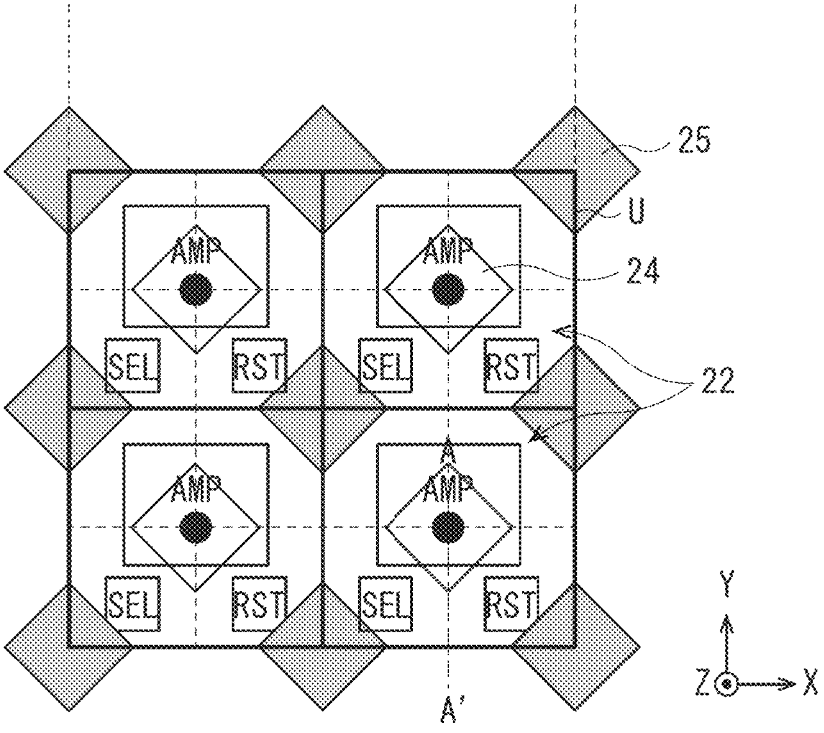

[ FIG. 21 ]
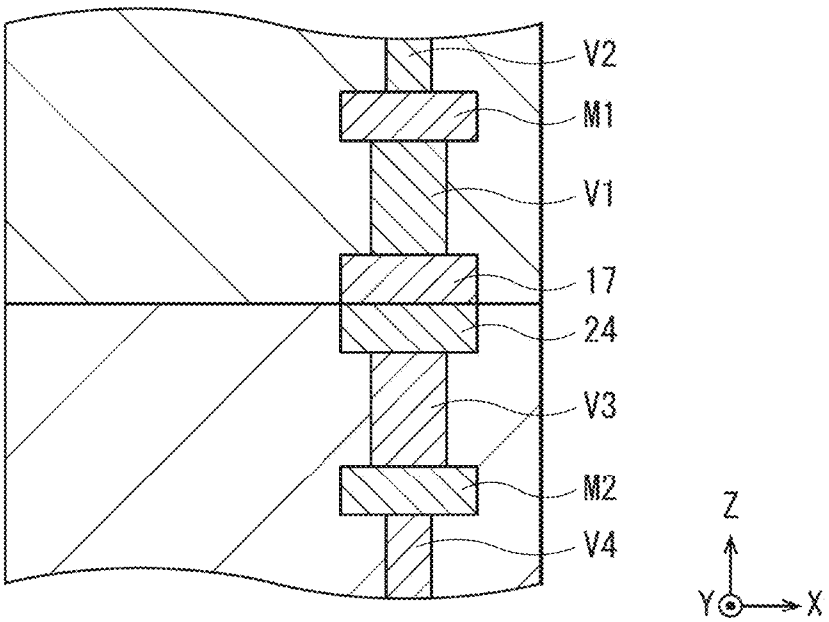

[ FIG. 22 ]
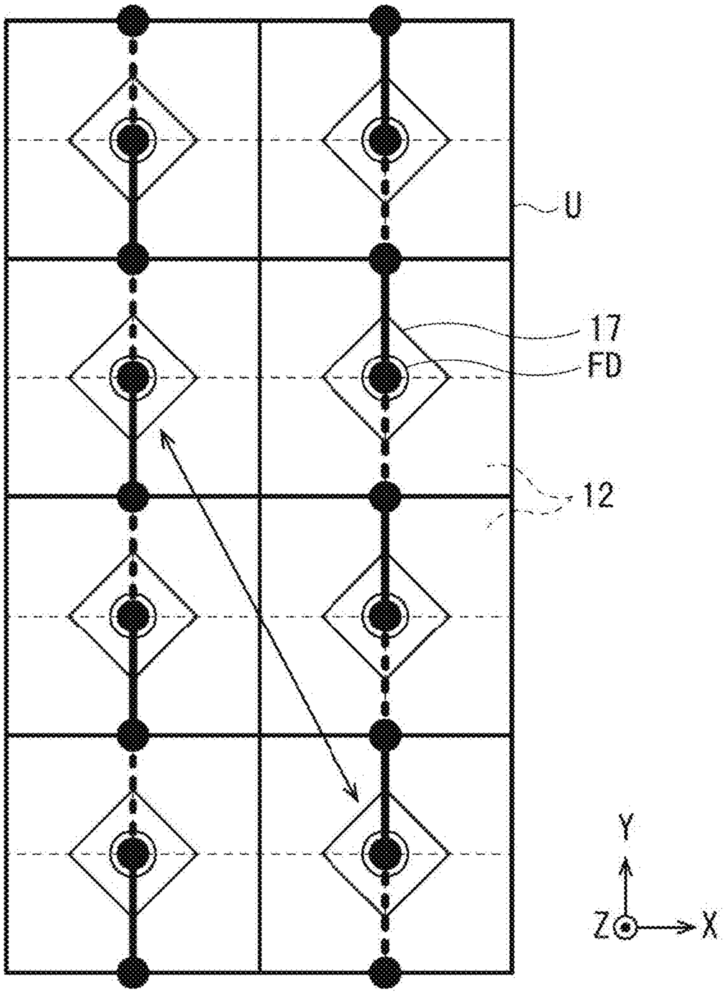

[ FIG. 23 ]
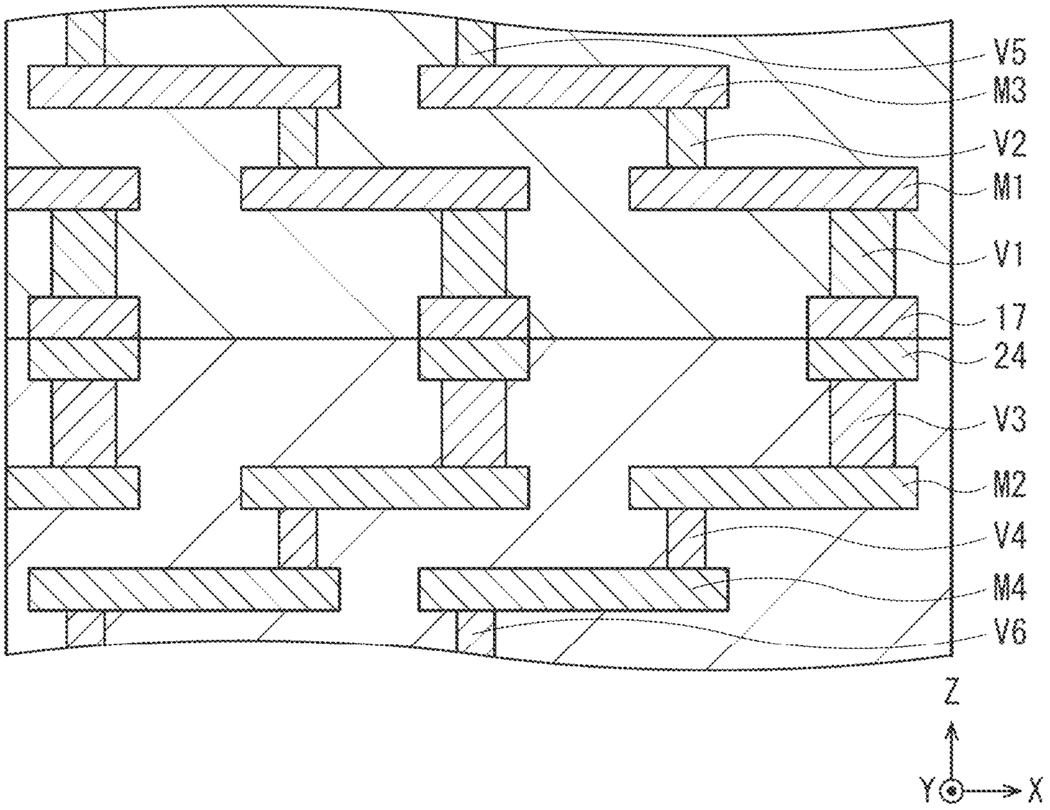
[ FIG. 24 ]
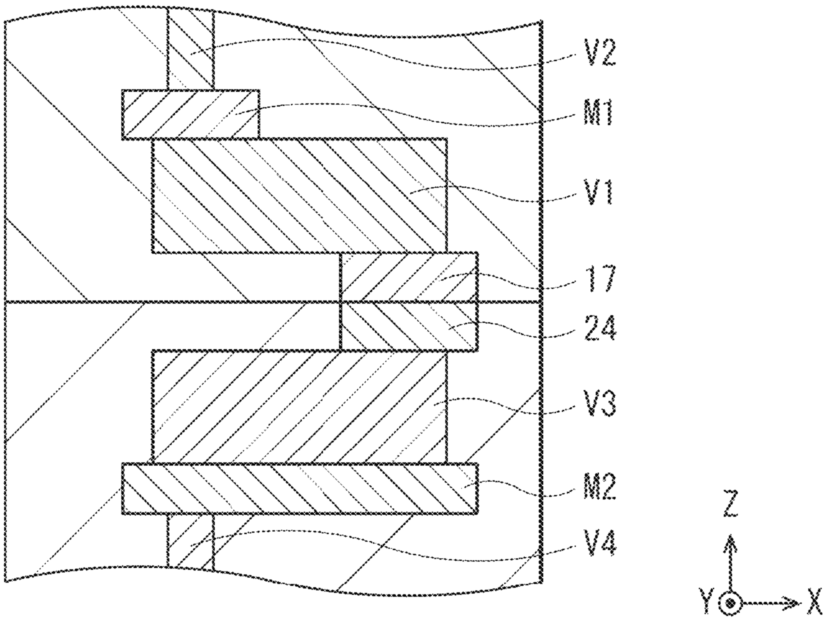

[ FIG. 25 ]
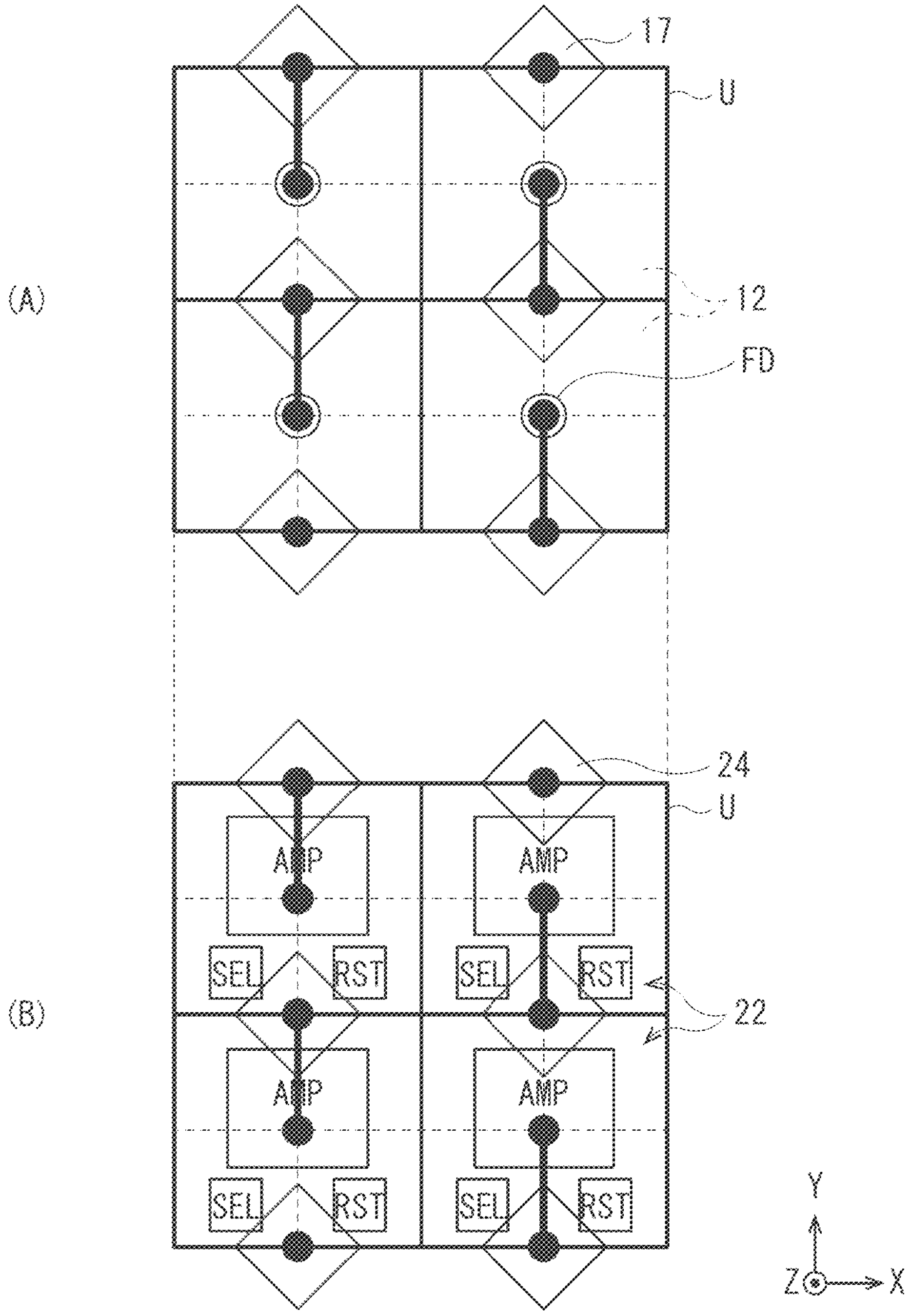

[ FIG. 26 ]
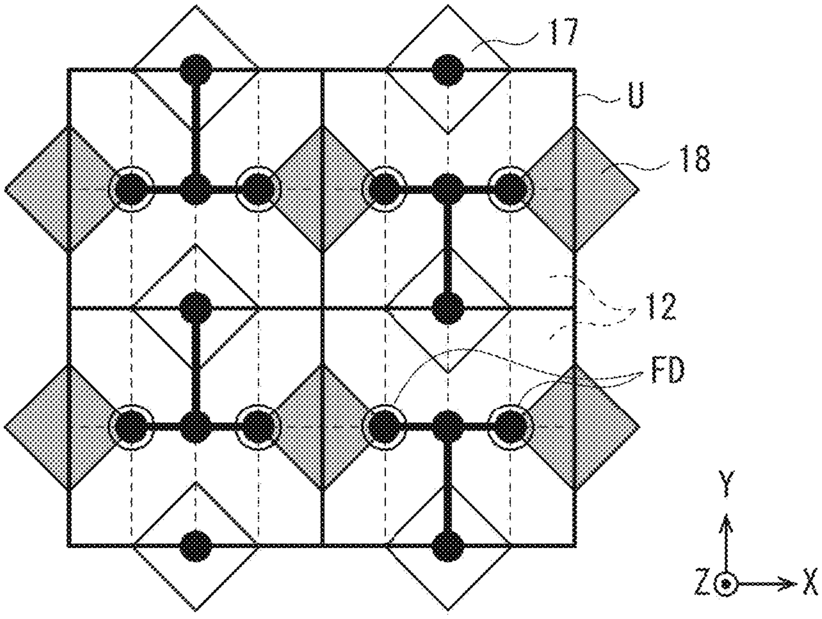

[ FIG. 27 ]
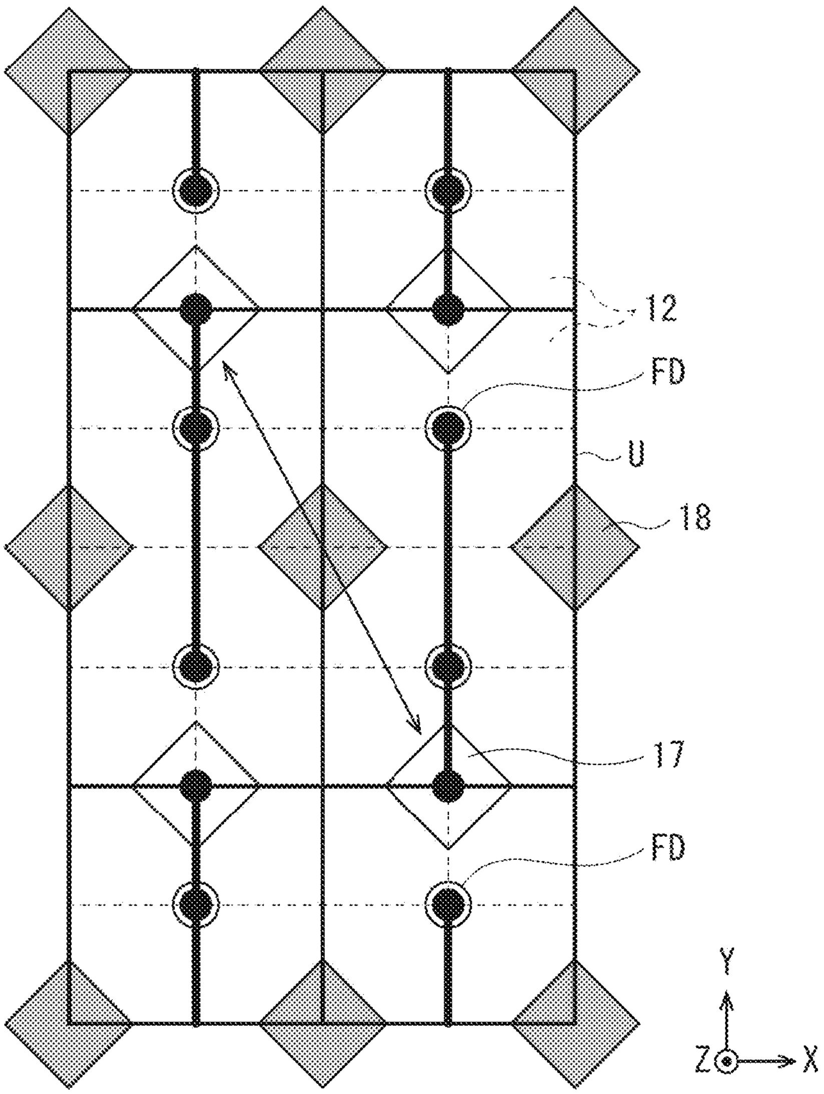

[ FIG. 28 ]
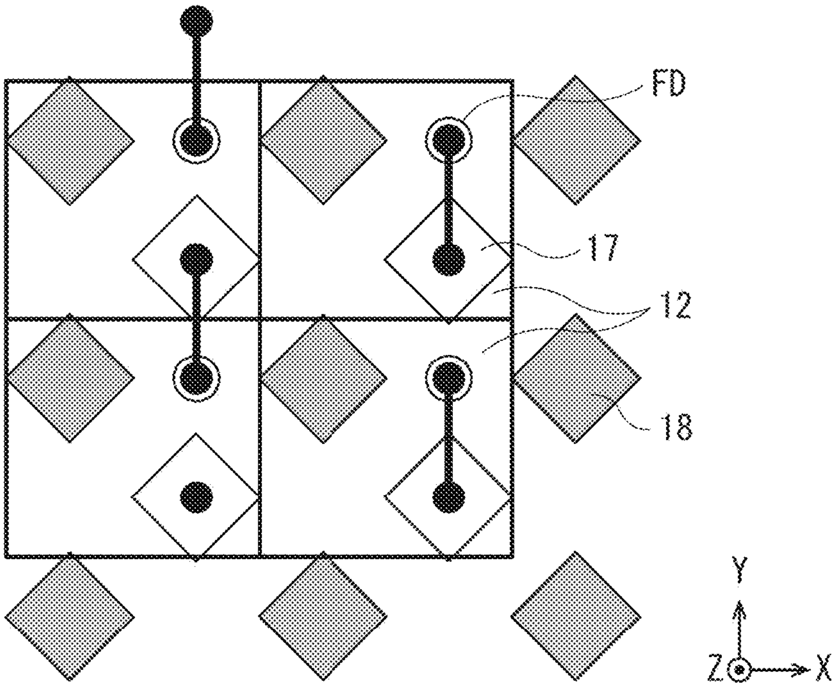
[ FIG. 29 ]
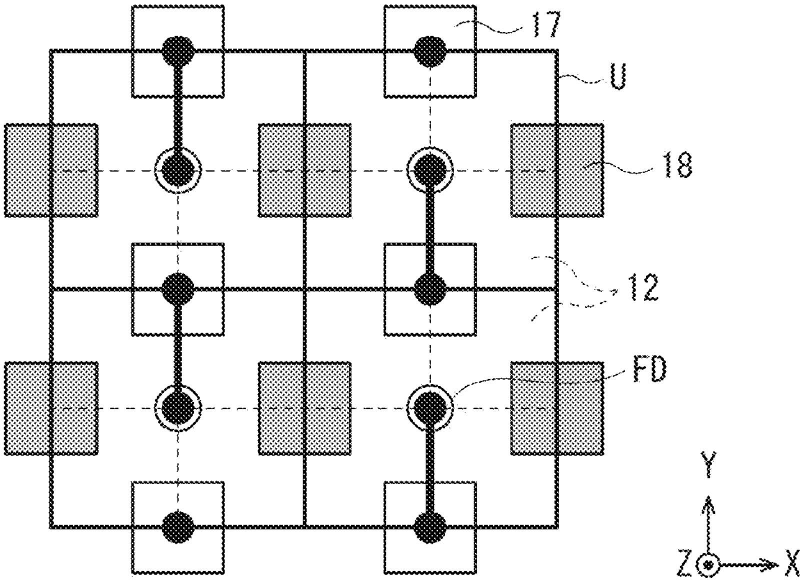

[ FIG. 30 ]
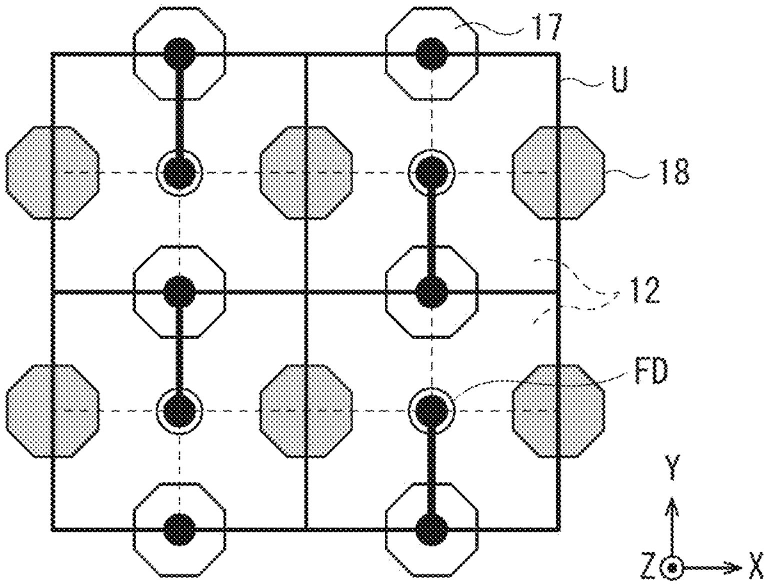
[ FIG. 31 ]
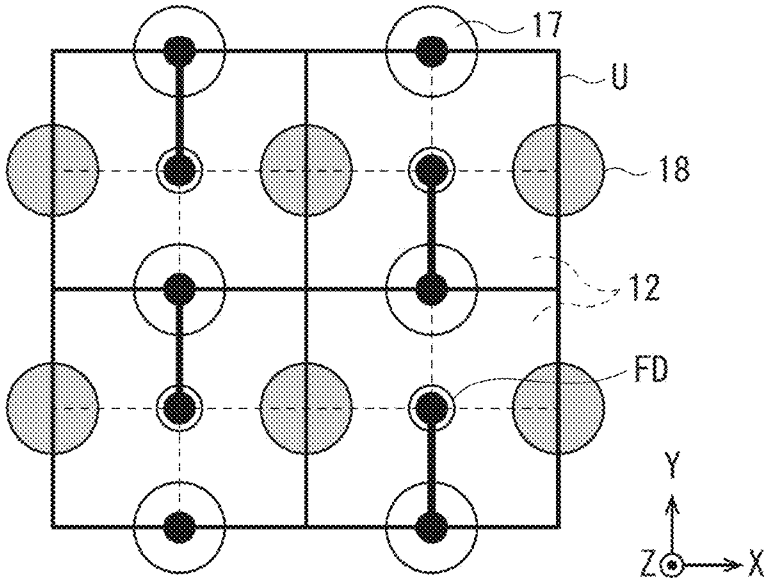

[ FIG. 32 ]
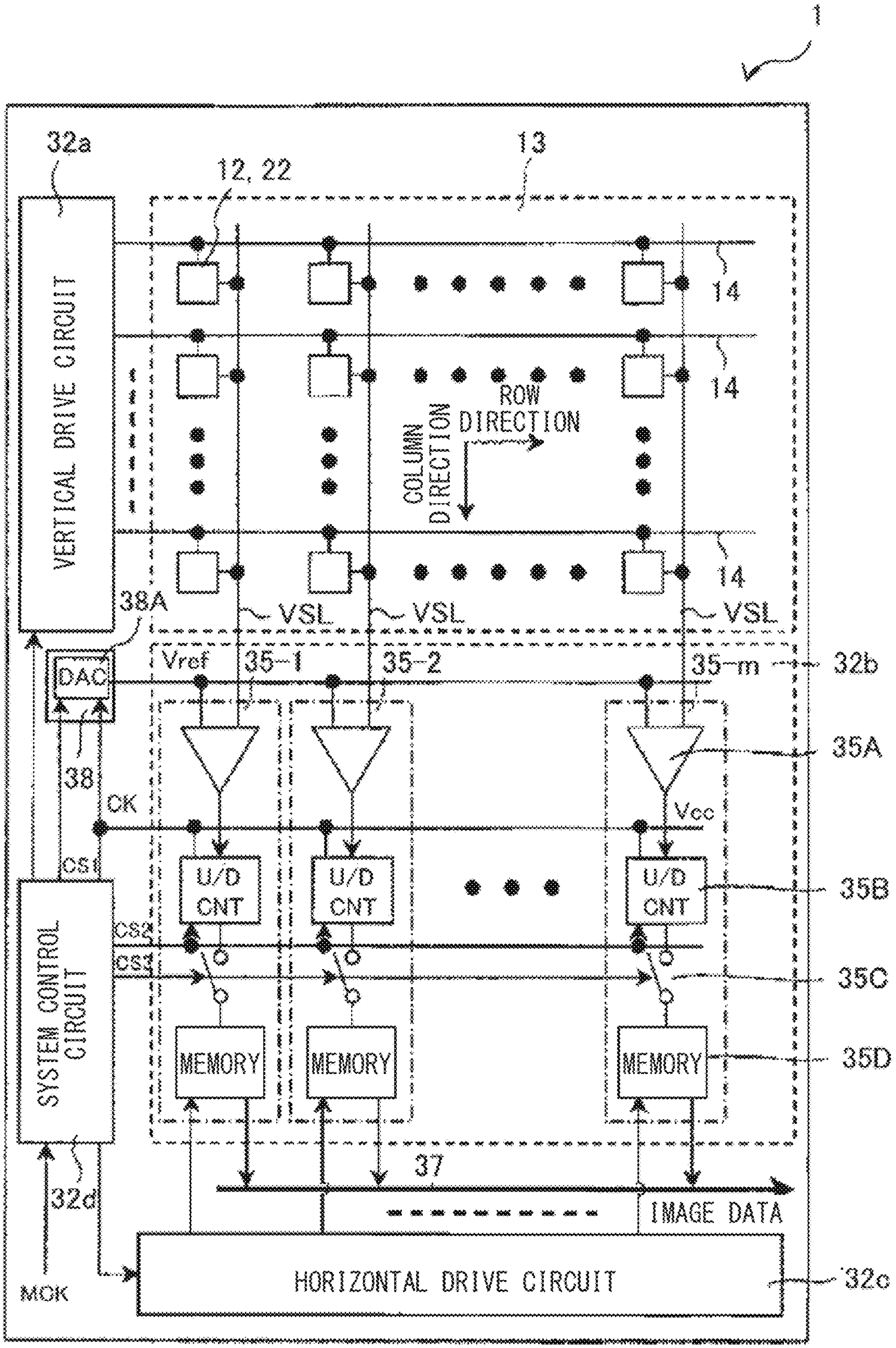

[ FIG. 33 ]
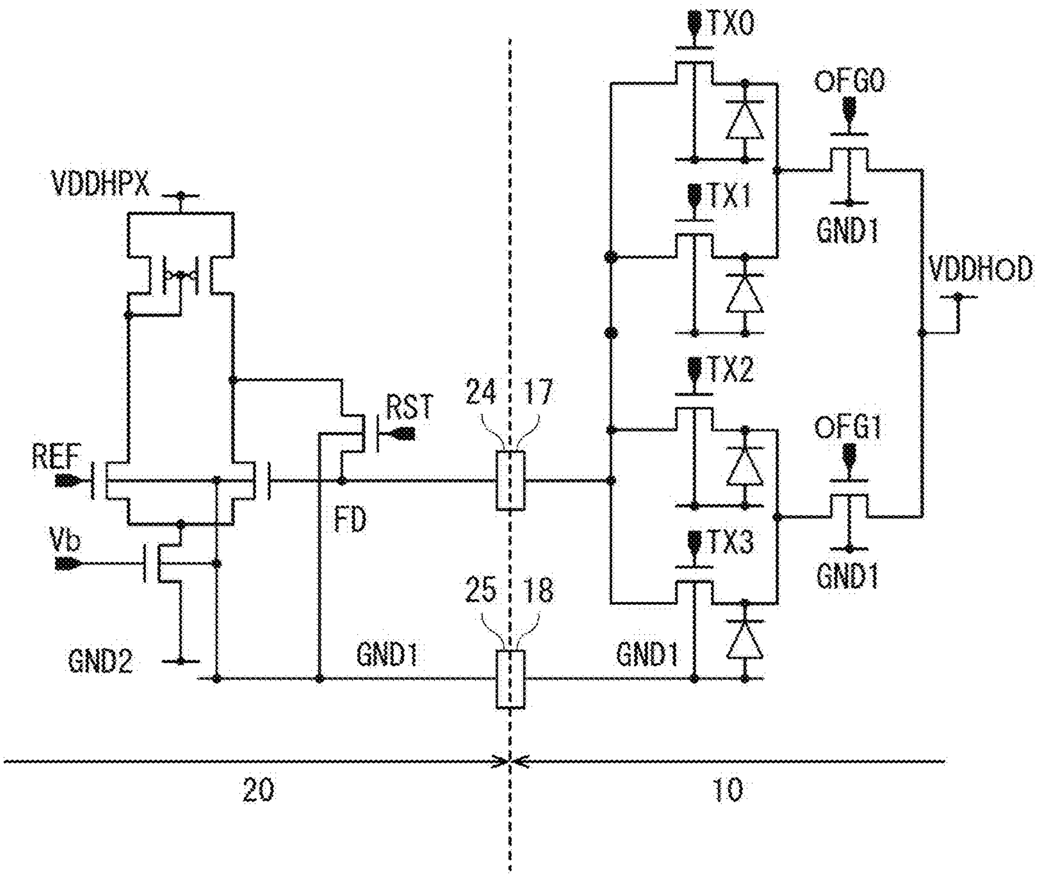
[ FIG. 34 ]
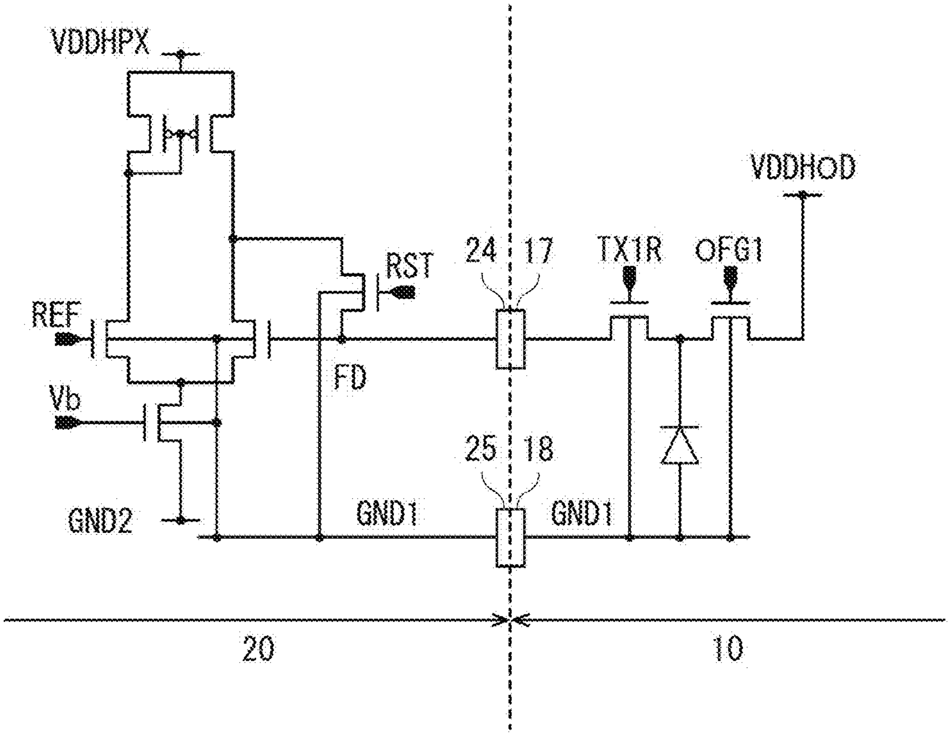

[ FIG. 35 ]
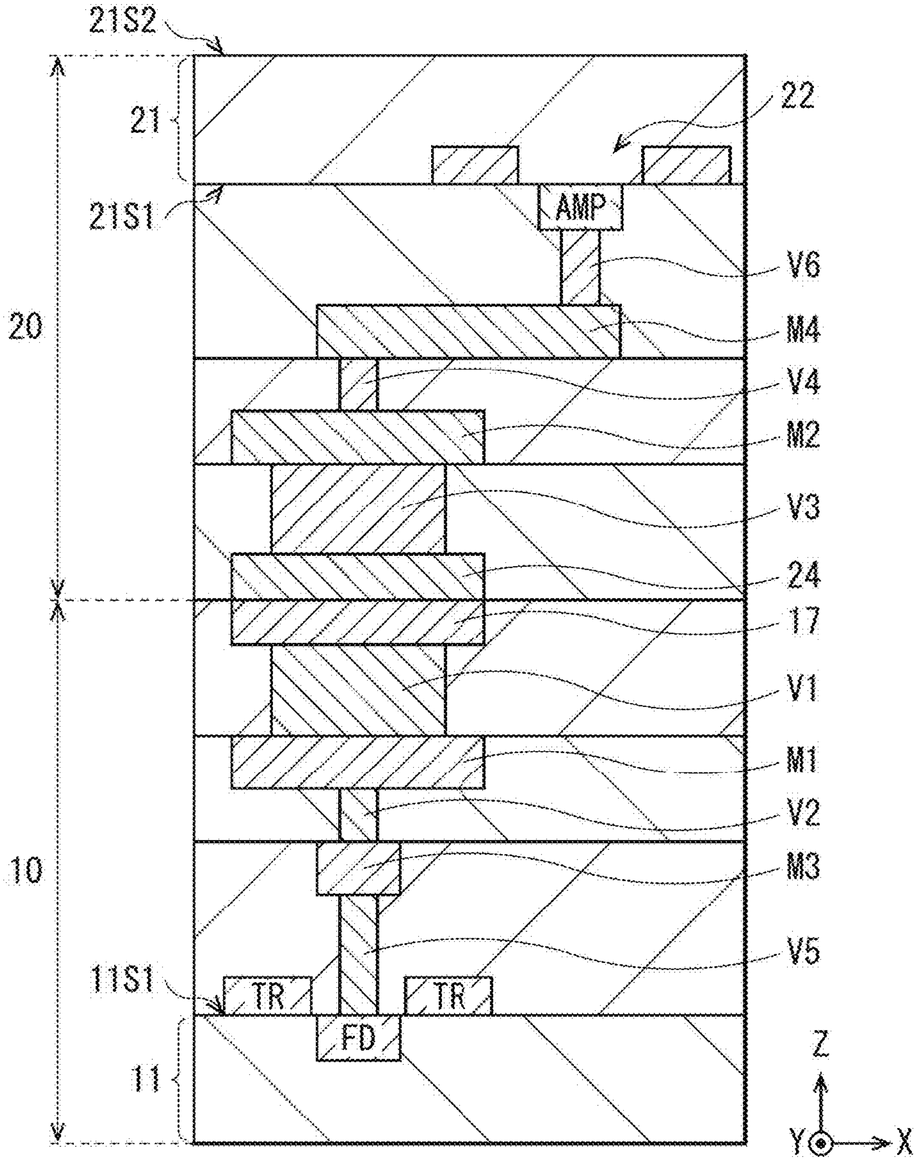

[ FIG. 36 ]
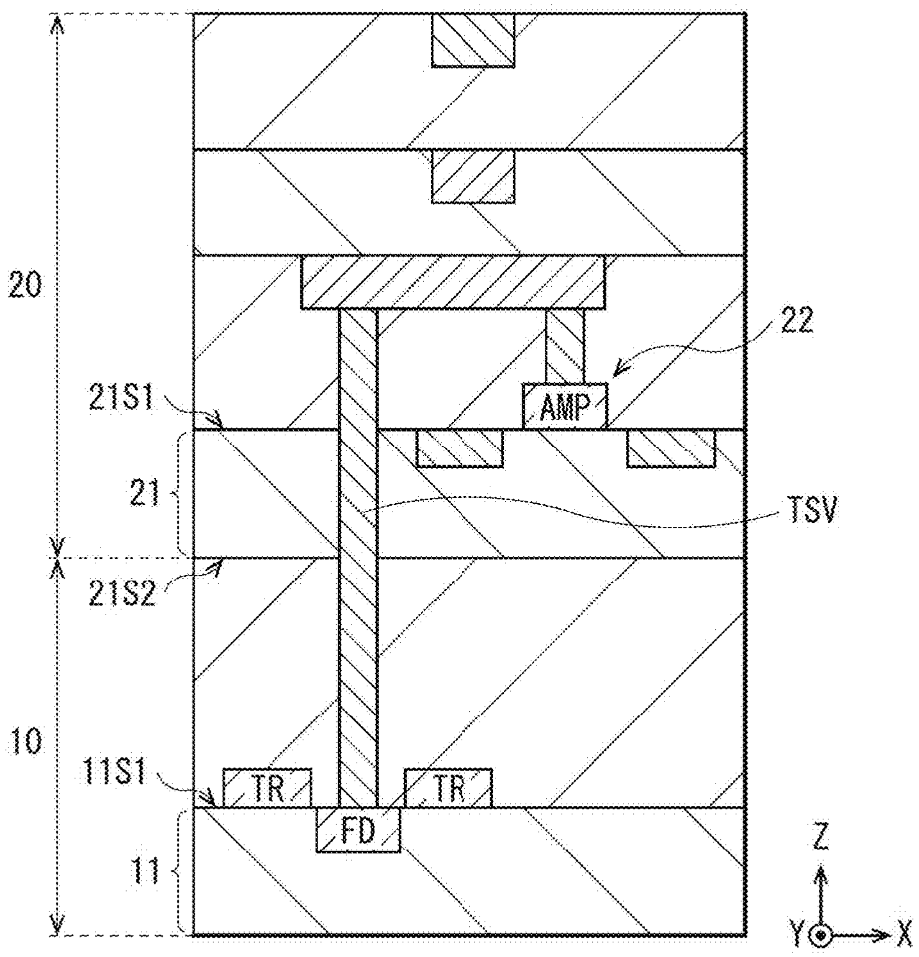

[ FIG. 37 ]
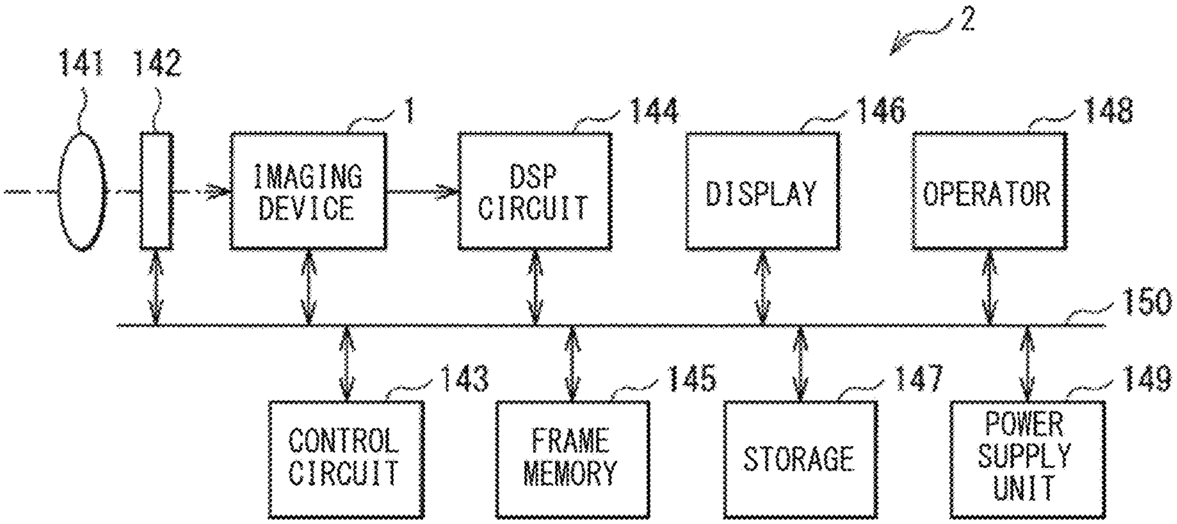
[ FIG. 38 ]
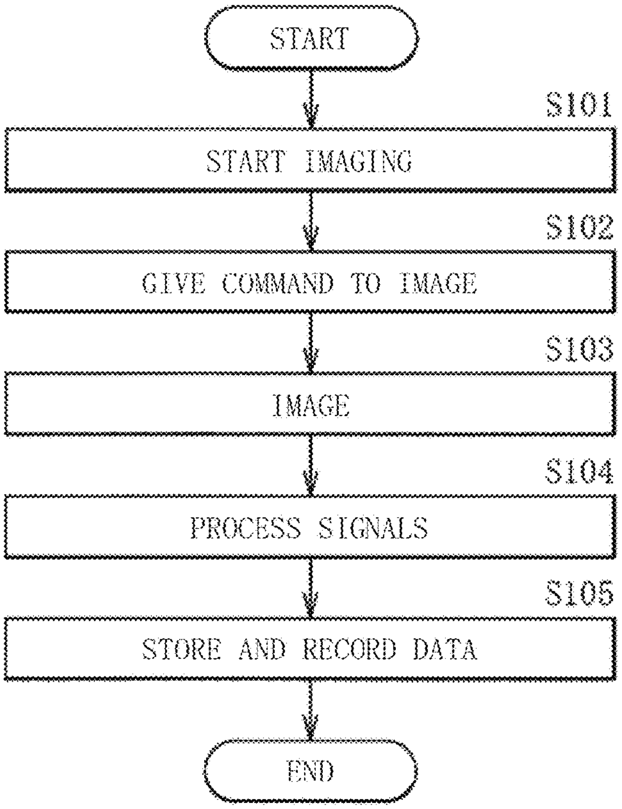

[ FIG. 40 ]

[ FIG. 42 ]
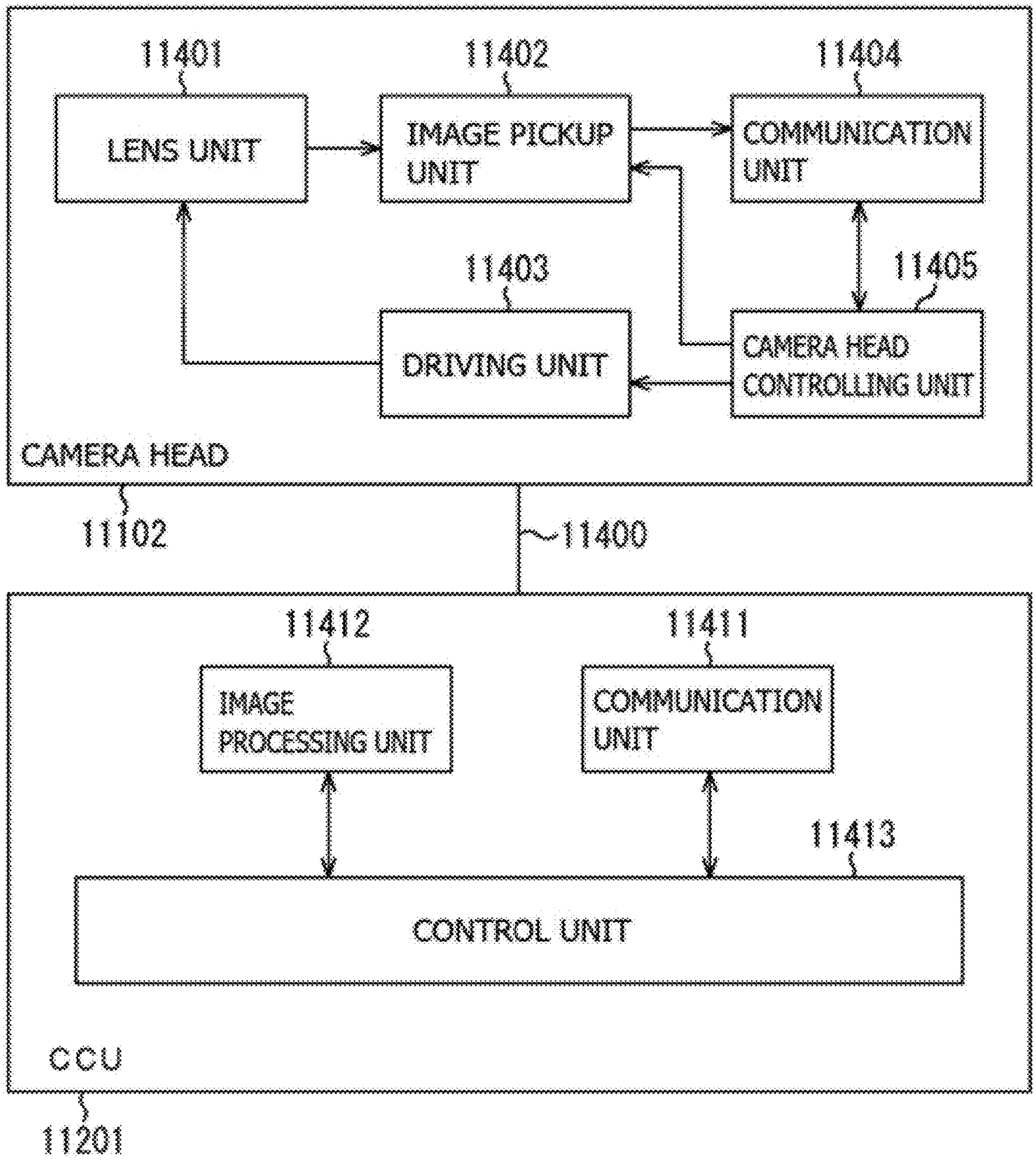

IMAGING DEVICE

TECHNICAL FIELD

The present disclosure relates to an imaging device.

BACKGROUND ART

For example, PLT 1 discloses an imaging device in which a shield electrode is provided between adjacent junction electrodes electrically coupled to floating diffusion layers (floating diffusions: FDs) of respective adjacent sensor pixels to thereby reduce signal interference caused by FD-FD coupling.

CITATION LIST

Patent Literature

PLT1: Japanese Unexamined Patent Application Publication No. 2020-88380

SUMMARY OF THE INVENTION

Incidentally, it is desirable to provide an imaging device of a three-dimensional structure that makes it possible to miniaturize a pixel while suppressing deterioration in image quality.

An imaging device according to an embodiment of the present disclosure includes: a first substrate including a pixel region, the pixel region including a plurality of sensor pixels and a plurality of floating diffusion layers, the plurality of sensor pixels being disposed in a matrix pattern and performing photoelectric conversion, the plurality of floating diffusion layers being disposed in a matrix pattern, being each provided for every one or more of the sensor pixels, and each temporarily holding electric charge generated through the photoelectric conversion in the one or more of the sensor pixels; a second substrate including a plurality of readout circuits, the plurality of readout circuits being each provided for every one or more of the sensor pixels and outputting a pixel signal based on the electric charge outputted from the sensor pixels; a plurality of first junction electrodes provided on a junction surface of the first substrate with the second substrate and electrically coupled to respective ones of the plurality of floating diffusion layers; and a plurality of second junction electrodes provided on a junction surface of the second substrate with the first substrate and joined to respective ones of the plurality of first junction electrodes, in which the first substrate and the second substrate are stacked on each other, and the electric charge temporarily held is read as signal charge at different timings of the respective ones of the plurality of floating diffusion layers electrically coupled to one of the first junction electrodes and one of the second junction electrodes that are joined to each other and to another one of the first junction electrodes and another one of the second junction electrodes that are joined to each other, the one of the first junction electrodes and the one of the second junction electrodes being adjacent to the other one of the first junction electrodes and the other one of the second junction electrodes in a row direction.

In the imaging device according to the embodiment of the present disclosure, the first substrate stacked thereon includes the plurality of sensor pixels disposed in a matrix pattern, and the plurality of floating diffusion layers that each temporarily holds the electric charge generated through the photoelectric conversion in the one or more of the sensor pixels, and the second substrate includes the plurality of readout circuits that is each provided for every one or more of the sensor pixels and outputs the pixel signal based on the electric charge outputted from the sensor pixels. The plurality of first junction electrodes electrically coupled to the respective ones of the plurality of floating diffusion layers and the plurality of second junction electrodes electrically coupled to the respective ones of the plurality of first junction electrodes are provided on the respective junction surfaces thereof. The electric charge temporarily held is read as signal charge at different timings of the respective ones of the plurality of floating diffusion layers electrically coupled to the one of the first junction electrodes and the one of the second junction electrodes that are joined to each other and to the other one of the first junction electrodes and the other one of the second junction electrodes that are joined to each other. The one of the first junction electrodes and the one of the second junction electrodes are adjacent to the other one of the first junction electrodes and the other one of the second junction electrodes in the row direction. This increases a distance between junction electrodes electrically coupled to respective ones of a plurality of floating diffusion layers from which signal charge is to be read at the same timing.

BRIEF DESCRIPTION OF THE DRAWINGS

FIG. 1 is a diagram illustrating a developed perspective configuration example of an imaging device according to an embodiment of the present disclosure.

FIG. 2 is a diagram illustrating an example of functional blocks of a logic circuit of FIG. 1.

FIG. 3 is a diagram illustrating an example of sensor pixels and a readout circuit of FIG. 1.

FIG. 4 is a diagram illustrating a cross-sectional configuration example in a vertical direction of the imaging device of FIG. 1.

FIG. 5 is a diagram illustrating a cross-sectional configuration example in a horizontal direction of a first substrate (A) and a second substrate (B) of the imaging device of FIG. 1.

FIG. 6 is a schematic cross-sectional view in the vertical direction of the imaging device, corresponding to a line A-A' illustrated in FIG. 5.

FIG. 7 is a schematic cross-sectional view in the vertical direction of the imaging device, corresponding to a line B-B' illustrated in FIG. 5.

FIG. 8 is a diagram illustrating an example of a layout of a plurality of drive wiring lines in a horizontal plane of the imaging device illustrated in FIG. 5.

FIG. 10A is a diagram illustrating a cross-sectional configuration example in the vicinity of through-wiring lines in FIG. 4.

FIG. 10B is a diagram illustrating a cross-sectional configuration example in the vicinity of the through-wiring lines in FIG. 4.

FIG. 10C is a diagram illustrating a cross-sectional configuration example in the vicinity of the through-wiring lines in FIG. 4.

FIG. 11A is a diagram illustrating a cross-sectional configuration example in the vicinity of the through-wiring lines in FIG. 4.

FIG. 11B is a diagram illustrating a cross-sectional configuration example in the vicinity of the through-wiring lines in FIG. 4.

FIG. 11C is a diagram illustrating a cross-sectional configuration example in the vicinity of the through-wiring lines in FIG. 4.

FIG. 12 is a schematic cross-sectional view in the vertical direction of an imaging device according to Modification Example 1 of the present disclosure.

FIG. 13 is a schematic cross-sectional view in the vertical direction of an imaging device according to Modification Example 2 of the present disclosure.

FIG. 14 is a schematic cross-sectional view in the vertical direction of an imaging device according to Modification Example 3 of the present disclosure.

FIG. 15 is a diagram illustrating a cross-sectional configuration example in the horizontal direction of a first substrate (A) and a second substrate (B) of an imaging device according to Modification Example 4 of the present disclosure.

FIG. 16 is a schematic cross-sectional view in the vertical direction of the imaging device, corresponding to a line A-A' illustrated in FIG. 15.

FIG. 17 is a diagram illustrating a cross-sectional configuration example in the horizontal direction of a first substrate (A) and a second substrate (B) of an imaging device according to Modification Example 5 of the present disclosure.

FIG. 18 is a schematic cross-sectional view in the vertical direction of the imaging device, corresponding to a line A-A' illustrated in FIG. 17.

FIG. 19 is a diagram illustrating an example of a wiring layout in a horizontal plane of the imaging device illustrated in FIG. 17.

FIG. 20 is a diagram illustrating a cross-sectional configuration example in the horizontal direction of a first substrate (A) and a second substrate (B) of an imaging device according to Modification Example 6 of the present disclosure.

FIG. 21 is a schematic cross-sectional view in the vertical direction of the imaging device, corresponding to a line A-A' illustrated in FIG. 20.

FIG. 22 is a diagram illustrating an example of arrangement of FD junction electrodes of an imaging device according to Modification Example 7 of the present disclosure.

FIG. 23 is a schematic cross-sectional view in the vertical direction of the imaging device illustrated in FIG. 22.

FIG. 24 is a schematic cross-sectional view in the vertical direction of an imaging device according to Modification Example 8 of the present disclosure.

FIG. 25 is a diagram illustrating a cross-sectional configuration example in the horizontal direction of a first substrate (A) and a second substrate (B) of an imaging device according to Modification Example 9 of the present disclosure.

FIG. 26 is a diagram illustrating an example of pixel sharing units of an imaging device according to Modification Example 10 of the present disclosure.

FIG. 27 is a diagram illustrating an example of pixel sharing units of an imaging device according to Modification Example 11 of the present disclosure.

FIG. 28 is a diagram illustrating an example of pixel sharing units of an imaging device according to Modification Example 12 of the present disclosure.

FIG. 29 is a diagram illustrating an example of a shape of junction electrodes of an imaging device according to Modification Example 13 of the present disclosure.

FIG. 30 is a diagram illustrating an example of a shape of junction electrodes of an imaging device according to Modification Example 14 of the present disclosure.

FIG. 31 is a diagram illustrating an example of a shape of junction electrodes of an imaging device according to Modification Example 15 of the present disclosure.

FIG. 32 is a diagram illustrating a modification example of a circuit configuration of the imaging device of FIG. 1.

FIG. 33 is a diagram illustrating an example of a configuration of sensor pixels and a readout circuit of an imaging device according to Modification Example 17 of the present disclosure.

FIG. 34 is a diagram illustrating an example of a configuration of a sensor pixel and a readout circuit of an imaging device according to Modification Example 18 of the present disclosure.

FIG. 35 is a schematic cross-sectional view of an example of a stacked structure of the imaging device illustrated in FIG. 17.

FIG. 36 is a schematic cross-sectional view of an example of a stacked structure of an imaging device according to Modification Example 19 of the present disclosure.

FIG. 37 is a diagram illustrating an example of a schematic configuration of an imaging system including the imaging device according to any of the above-described embodiment or modification examples thereof.

FIG. 38 is a diagram illustrating an example of imaging steps in the imaging system of FIG. 37.

FIG. 42 is a block diagram depicting an example of a functional configuration of a camera head and a camera control unit (CCU).

MODES FOR CARRYING OUT THE INVENTION

Figure 9:
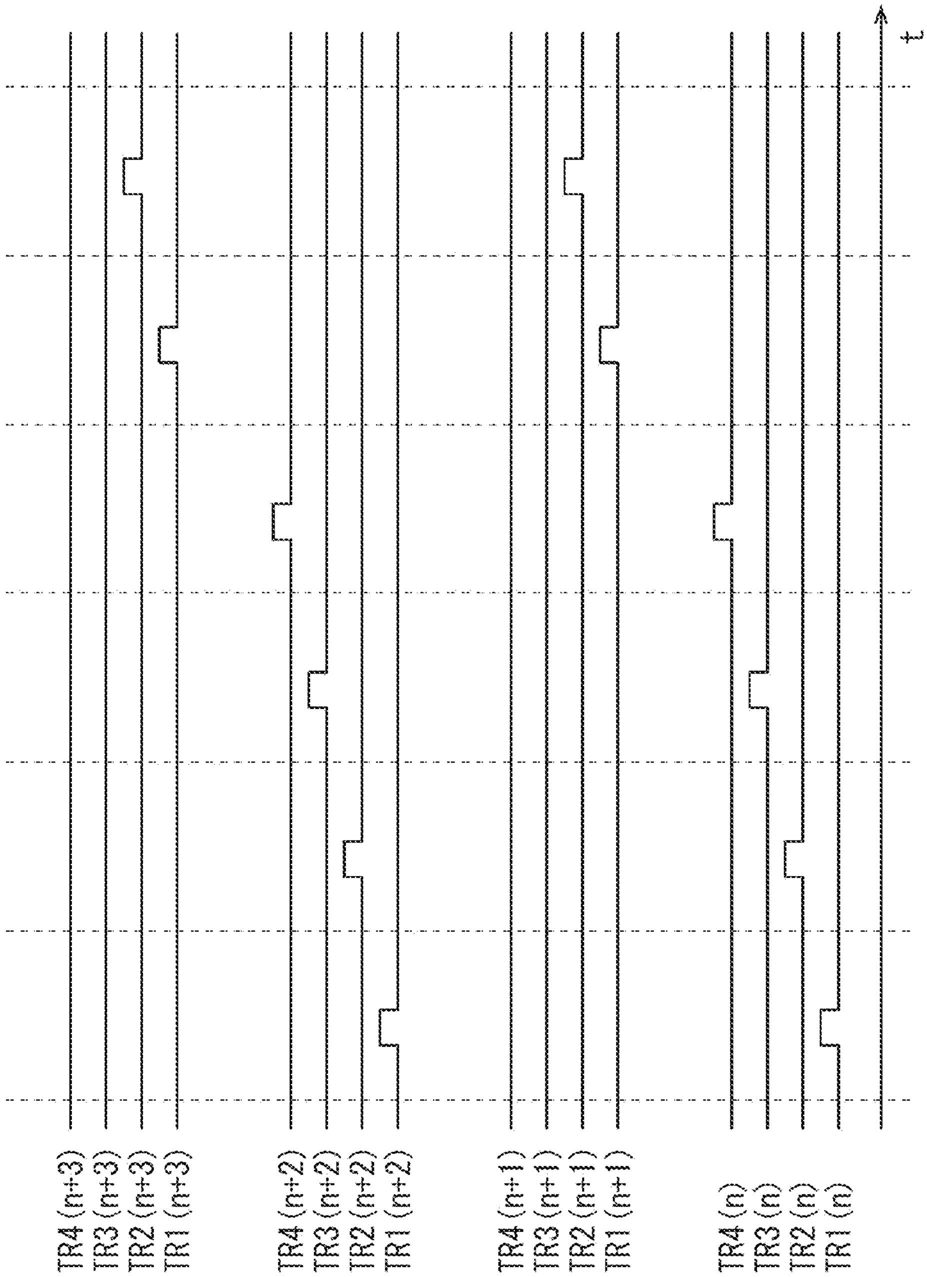
FIG. 9 is a timing diagram illustrating reading of signal charge of the imaging device illustrated in FIG. 5.

Hereinafter, a detailed description is given of an embodiment of the present disclosure with reference to the drawings. It is to be noted that the description is given in the following order.

1. Embodiment (An example of an imaging device in which signals are read at different timings from FDs coupled to respective FD junction electrodes adjacent to each other in a row direction)
2. Modification Examples
   - 2-1. Modification Example 1 (Another example of a configuration of shield electrodes)
   - 2-2. Modification Example 2 (Another example of the configuration of the shield electrodes)
   - 2-3. Modification Example 3 (Another example of the configuration of the shield electrodes)
   - 2-4. Modification Example 4 (Another example of a layout of a first substrate and a second substrate)
   - 2-5. Modification Example 5 (Another example of the layout of the first substrate and the second substrate)
   - 2-6. Modification Example 6 (Another example of the layout of the first substrate and the second substrate)
   - 2-7. Modification Example 7 (Another example of arrangement of the FD junction electrodes)
   - 2-8. Modification Example 8 (Another example of a wiring structure in the vicinity of junction surfaces)
   - 2-9. Modification Example 9 (An example in which the shield electrodes are omitted)

2-10. Modification Example 10 (Another example of a configuration of pixel sharing units)
2-11. Modification Example 11 (Another example of the configuration of the pixel sharing units)
2-12. Modification Example 12 (Another example of the configuration of the pixel sharing units)
2-13. Modification Example 13 (Another example of a shape of junction electrodes)
2-14. Modification Example 14 (Another example of the shape of the junction electrodes)
2-15. Modification Example 15 (Another example of the shape of the junction electrodes)
2-16. Modification Example 16 (Another example of a circuit configuration)
2-17. Modification Example 17 (Another example of a configuration of a readout circuit)
2-18. Modification Example 18 (Another example of the configuration of the readout circuit)
2-19. Modification Example 19 (Another example of a stacked structure)
3. Application Example
4. Practical Application Examples

1. EMBODIMENT

[Configuration of Imaging Device]

FIG. 1 illustrates an example of a schematic configuration of an imaging device 1 according to an embodiment of the present disclosure. For example, the imaging device 1 includes three substrates (a first substrate 10, a second substrate 20, and a third substrate 30). The imaging device 1 is an imaging device of a three-dimensional structure having a configuration in which the three substrates (the first substrate 10, the second substrate 20, and the third substrate 30) are bonded to each other. The first substrate 10, the second substrate 20, and the third substrate 30 are stacked in this order.

The first substrate 10 includes, in a semiconductor substrate 11, a plurality of sensor pixels 12 that performs photoelectric conversion. The plurality of sensor pixels 12 is provided in a matrix pattern in a pixel region 13 of the first substrate 10. The first substrate 10 includes, for example, a plurality of drive wiring lines 14 extending in a row direction. The plurality of drive wiring lines 14 is electrically coupled to a vertical drive circuit 32*a* (described later).

The second substrate 20 includes, in a semiconductor substrate 21, readout circuits 22 that output pixel signals based on electric charge outputted from the sensor pixels 12. The readout circuits are provided one by one for every one or more of the sensor pixels 12. The plurality of readout circuits 22 is provided in a matrix pattern in a readout circuit region 23 of the second substrate 20. The second substrate 20 includes, for example, a plurality of drive wiring lines extending in a row direction, and a plurality of vertical signal lines VSL (described later) extending in a column direction. The plurality of drive wiring lines provided in the second substrate 20 is electrically coupled to the vertical drive circuit 32*a* described later. The plurality of vertical signal lines VSL is electrically coupled to a column signal processing circuit 32*b* described later.

The third substrate 30 includes, in a semiconductor substrate 31, a logic circuit 32 and a booster circuit 33. The logic circuit 32 controls each of the sensor pixels 12 and each of the readout circuits 22, and processes a pixel signal obtained from each of the readout circuits 22. The logic circuit 32 includes, for example, the vertical drive circuit 32*a*, the column signal processing circuit 32*b*, a horizontal drive circuit 32*c*, and a system control circuit 32*d*, as illustrated in FIG. 2. The logic circuit 32 outputs an output voltage Vout obtained for each of the sensor pixels 12 to the outside.

The vertical drive circuit 32*a* sequentially selects the plurality of sensor pixels 12 on a row-by-row basis, for example. The vertical drive circuit 32*a* is, for example, electrically coupled to the plurality of drive wring lines 14. The vertical drive circuit 32*a* sequentially selects the plurality of sensor pixels 12 on a row-by-row basis by outputting selection signals in sequence to the plurality of drive wring lines 14.

The column signal processing circuit 32*b* performs correlated double sampling (Correlated Double Sampling: CDS) processing on a pixel signal outputted from each of the sensor pixels 12 of a row selected by the vertical drive circuit 32*a*, for example. The column signal processing circuit 32*b* extracts a signal level of the pixel signal by performing, for example, the CDS processing to hold pixel data corresponding to an amount of light received by each of the sensor pixels 12. The column signal processing circuit 32*b* is, for example, electrically coupled to the plurality of vertical signal lines VSL described later, and acquires the pixel signal from each of the sensor pixels 12 of the row selected by the vertical drive circuit 32*a* through the plurality of vertical signal lines VSL. The column signal processing circuit 32*b* includes, for example, an ADC (analog-to-digital) for each of the vertical signal lines VSL, and converts an analog pixel signal acquired through the plurality of vertical signal lines VSL into a digital pixel signal.

The horizontal drive circuit 32*c* outputs in sequence, as the output voltage Vout, the pixel data held in the column signal processing circuit 32*b* to the outside, for example. The system control circuit 32*d* controls, for example, driving of respective blocks (the vertical drive circuit 32*a*, the column signal processing circuit 32*b*, and the horizontal drive circuit 32*c*) in the logic circuit 32. The booster circuit 33 generates, for example, a power supply potential VDD of a predetermined magnitude.

FIG. 3 illustrates an example of the sensor pixels 12 and the readout circuit 22. Hereinafter, a description is given of a case where four sensor pixels 12 share one readout circuit 22, as illustrated in FIG. 3. Here, the term "sharing" indicates that outputs of the plurality of sensor pixels 12 are inputted into the common readout circuit 22.

The respective sensor pixels 12 include components common to each other. In FIG. 3, identification numbers (1, 2, 3, and 4) are assigned to endings of reference signs of the components of the respective sensor pixels 12 to distinguish the components of the respective sensor pixels 12 from each other. Hereinafter, in a case where the components of the respective sensor pixels 12 are to be distinguished from each other, the identification numbers are assigned to the endings of the reference signs of the components of the respective sensor pixels 12. However, in a case where the components of the respective sensor pixels 12 are not to be distinguished from each other, the identification numbers assigned to the endings of the reference signs of the components of the respective sensor pixels 12 are omitted.

Each of the sensor pixels 12 includes, for example, a photodiode PD, a transfer transistor TR electrically coupled to the photodiode PD, and a floating diffusion FD that temporarily holds electric charge outputted from the photodiode PD through the transfer transistor TR. For example, one floating diffusion FD is provided for the plurality of sensor pixels 12 sharing the readout circuit 22. It is to be noted that one floating diffusion FD may be provided for one sensor pixel 12. In this case, wiring lines that electrically couple the respective floating diffusions FD to each other are provided in the plurality of sensor pixels 12 sharing the readout circuit 22.

The photodiode PD generates electric charge corresponding to the amount of received light by performing photoelectric conversion. A cathode of the photodiode PD is electrically coupled to a source of the transfer transistor TR. An anode of the photodiode PD is electrically coupled to a region (a p-well region 41 described later) having a reference potential VSS in the semiconductor substrate 11. A drain of the transfer transistor TR is electrically coupled to the floating diffusion FD. A gate of the transfer transistor TR is electrically coupled to the logic circuit 32 through the drive wiring line 14 and a through-wiring line 42 described later. The transfer transistor TR is, for example, a CMOS (Complementary Metal Oxide Semiconductor) transistor.

The floating diffusion FD is a floating diffusion region that temporarily holds the electric charge outputted from the photodiode PD through the transfer transistor TR. An input terminal of the readout circuit 22 is coupled to the floating diffusion FD. Specifically, a reset transistor RST described later is coupled to the floating diffusion FD, and the vertical signal line VSL is further coupled to the floating diffusion FD through an amplification transistor AMP described later and a selection transistor SEL described later. The floating diffusion FD generates capacitance Cfd. For example, the capacitance Cfd is generated between the region (e.g., the p-well region 41) having the reference potential VSS in the first substrate 10 and a wiring line that couples each of the sensor pixels 12 and an FD junction electrode 17, as illustrated in FIG. 3.

The readout circuit 22 includes, for example, the reset transistor RST, the selection transistor SEL, and the amplification transistor AMP. It is to be noted that the selection transistor SEL may be omitted as necessary. A source of the reset transistor RST (the input terminal of the readout circuit 22) is electrically coupled to the floating diffusion FD. A drain of the reset transistor RST is electrically coupled to a wiring line to which the power supply potential VDD is to be applied through a through-wiring line 43 described later, and to a drain of the amplification transistor AMP. A gate of the reset transistor RST is electrically coupled to the logic circuit 32 through the through-wiring line 42. A source of the amplification transistor AMP is electrically coupled to a drain of the selection transistor SEL. A gate of the amplification transistor AMP is electrically coupled to the source of the reset transistor RST. A source of the selection transistor SEL (an output terminal of the readout circuit 22) is electrically coupled to the logic circuit 32 through the vertical signal line VSL and the through-wiring line 42. A gate of the selection transistor SEL is electrically coupled to the logic circuit 32 through the through-wiring line 42.

When the transfer transistor TR is brought into an on state, the transfer transistor TR transfers the electric charge of the photodiode PD to the floating diffusion FD. The reset transistor RST resets a potential of the floating diffusion FD to a predetermined potential. When being brought into the on state, the reset transistor RST resets the potential of the floating diffusion FD to the power supply potential VDD. The selection transistor SEL controls an output timing of the pixel signal from the readout circuit 22. The amplification transistor AMP generates, as the pixel signal, a signal of a voltage corresponding to a level of the electric charge held in the floating diffusion FD. The amplification transistor AMP configures a source follower amplifier, and outputs a pixel signal of the voltage corresponding to the level of the electric charge generated in the photodiode PD. When the selection transistor SEL is brought into the on state, the amplification transistor AMP amplifies the potential of the floating diffusion FD to output a voltage corresponding to the potential to the logic circuit 32 through the vertical signal line VSL. The reset transistor RST, the amplification transistor AMP, and the selection transistor SEL are, for example, CMOS transistors.

It is to be noted that the selection transistor SEL may be provided between the power supply line VDD and the amplification transistor AMP. In this case, the drain of the reset transistor RST is electrically coupled to the wiring line to which the power supply potential VDD is to be applied, and to the drain of the selection transistor SEL. The source of the selection transistor SEL is electrically coupled to the drain of the amplification transistor AMP. The gate of the selection transistor SEL is electrically coupled to the logic circuit 32 through the through-wiring line 42. The source of the amplification transistor AMP (the output terminal of the readout circuit 22) is electrically coupled to the logic circuit 32 through the vertical signal line VSL and the through-wiring line 42. The gate of the amplification transistor AMP is electrically coupled to the source of the reset transistor RST.

FIG. 4 illustrates an example of a cross-sectional configuration in a vertical direction of the imaging device 1. FIG. 4 illustrates, as examples, a cross-sectional configuration of a location opposed to the pixel region 13 (the sensor pixels 12) and a cross-sectional configuration of a region surrounding the pixel region 13 in the imaging device 1. The imaging device 1 is configured as a stack in which the first substrate 10, the second substrate 20, and the third substrate 30 are stacked in this order, and further includes a color filter layer 40 and a light-receiving lens 50 on a side of a back surface (a side of a light incident surface) of the first substrate 10. The color filter layer 40 and the light-receiving lens 50 are each provided, for example, one by one for each of the sensor pixels 12. That is, the imaging device 1 is a back side illumination imaging device.

The first substrate 10 is configured as a stack in which an insulating layer 19 is stacked on the semiconductor substrate 11. The first substrate 10 includes the insulating layer 19 as an interlayer insulating film. The insulating layer 19 is provided between the semiconductor substrate 11 and the second substrate 20. The first substrate 10 includes the plurality of drive wiring lines 14 in the insulating layer 19. The plurality of drive wiring lines 14 is provided one by one for each of the rows in the plurality of sensor pixels 12 disposed in a matrix pattern. The semiconductor substrate 11 includes a silicon substrate. The semiconductor substrate 11 includes, for example, the p-well region 41 on a portion of a front surface thereof and in the vicinity of such a portion, and includes the photodiode PD of an electrically-conductive type different from the p-well region 41 in a region other than the p-well region 41 (a region deeper than the p-well region 41). The p-well region 41 includes a p-type semiconductor region. The photodiode PD includes a semiconductor region of an electrically-conductive type (specifically, an n-type) different from the p-well region 41. The semiconductor substrate 11 includes in the p-well region 41 the floating diffusions FD as a semiconductor region of an electrically-conductive type (specifically, the n-type) different from the p-well region 41.

The first substrate 10 includes the photodiode PD and the transfer transistor TR for each of the sensor pixels 12, and includes the floating diffusion FD for every one or more of the sensor pixels 12. The first substrate 10 is configured in such a manner that the transfer transistor TR and the floating diffusion FD are provided at a portion on the side of the front surface of the semiconductor substrate 11 (an opposite side to the side of the light incident surface, i.e., a side of the second substrate 20). The first substrate 10 includes an element separator that separates each of the sensor pixels 12. The element separator is formed to extend in a normal direction of the semiconductor substrate 11 (in a direction perpendicular to the front surface of the semiconductor substrate 11). The element separator is provided between two sensor pixels 12 adjacent to each other. The element separator electrically separates the two sensor pixels 12 adjacent to each other. The element separator includes, for example, silicon oxide. The first substrate 10 further includes, for example, a fixed charge film in contact with a back surface of the semiconductor substrate 11. The fixed charge film is negatively charged to suppress generation of a dark current caused by an interface state of a side of a light-receiving surface of the semiconductor substrate 11. The fixed charge film is formed by, for example, an insulating film having negative fixed charge. Examples of a material of such an insulating film include hafnium oxide, zirconium oxide, aluminum oxide, titanium oxide, and tantalum oxide. A hole accumulation layer is provided at an interface on the side of the light-receiving surface of the semiconductor substrate 11 by an electric field induced by the fixed charge film. The hole accumulation layer suppresses generation of electrons from the interface. The color filter layer 40 is provided on the side of the back surface of the semiconductor substrate 11. The color filter layer 40 is provided, for example, in contact with the fixed charge film, and is provided at a position opposed to the sensor pixel 12 with the fixed charge film interposed therebetween. The light-receiving lens 50 is provided, for example, in contact with the color filter layer 40, and is provided at a position opposed to the sensor pixel 12 with the color filter layer 40 and the fixed charge film interposed therebetween.

The first substrate 10 includes, in the insulating layer 19, a plurality of FD through-wiring lines 15 and a plurality of VSS through-wiring lines 16. The plurality of FD through-wiring lines 15 and the plurality of VSS through-wiring lines penetrate the insulating layer 19. Each of the VSS through-wiring lines 16 is disposed in a gap between two FD through-wiring lines 15 adjacent to each other among the plurality of FD through-wiring lines 15. The first substrate 10 further includes, in the insulating layer 19, a plurality of FD junction electrodes 17 and a plurality of VSS junction electrodes 18. The plurality of FD junction electrodes 17 and the plurality of VSS junction electrodes 18 are both exposed on a surface of the insulating layer 19. The FD junction electrode 17 corresponds to a specific example of a "first junction electrode" of the present disclosure. The VSS junction electrode 18 corresponds to a specific example of a "third junction electrode" of the present disclosure. The plurality of FD through-wiring lines 15 and the plurality of VSS through-wiring lines 16 are provided in a region opposed to the pixel region 13. Each of the VSS junction electrodes 18 is formed in the same plane as each of the FD junction electrodes 17. The VSS junction electrode 18 is disposed in a gap between two FD junction electrodes 17 adjacent to each other among the plurality of FD junction electrodes 17.

In a case where one floating diffusion FD is provided for the plurality of sensor pixels 12 sharing the readout circuit 22, the plurality of FD through-wiring lines 15 is provided one by one for every plurality of sensor pixels 12 sharing the readout circuit 22. In a case where one floating diffusion FD is provided for one sensor pixel 12, the plurality of FD through-wiring lines 15 is provided one by one for each of the sensor pixels 12.

Each of the FD through-wiring lines 15 is coupled to the floating diffusion FD and the FD junction electrode 17. In a case where one floating diffusion FD is provided for the plurality of sensor pixels 12 sharing the readout circuit 22, the plurality of VSS through-wiring lines 16 is provided one by one for every plurality of sensor pixels 12 sharing the readout circuit 22. In a case where one floating diffusion FD is provided for one sensor pixel 12, the plurality of VSS through-wiring lines 16 is provided one by one for each of the sensor pixels 12. Each of the VSS through-wiring lines 16 is coupled to the p-well region 41 and the VSS junction electrode 18. In either case, the plurality of VSS through-wiring lines 16 is provided one by one for each of the readout circuits 22.

The second substrate 20 is configured as a stack in which an insulating layer 28 is stacked on the semiconductor substrate 21. The second substrate 20 includes the insulating layer 28 as an interlayer insulating film. The insulating layer 28 is provided between the semiconductor substrate 21 and the first substrate 10. The semiconductor substrate 21 includes a silicon substrate. The second substrate 20 includes one readout circuit 22 for every four sensor pixels 12. The second substrate 20 is configured in such a manner that the readout circuit 22 is provided at a portion on a side of a front surface of the semiconductor substrate 21. The second substrate 20 is bonded to the first substrate 10 with the front surface of the semiconductor substrate 21 directed toward the side of the front surface of the semiconductor substrate 11.

The second substrate 20 includes, in the insulating layer 28, a plurality of FD through-wiring lines 26 and a plurality of VSS through-wiring lines 27. The plurality of FD through-wiring lines 26 and the plurality of VSS through-wiring lines 27 penetrate the insulating layer 28. Each of the VSS through-wiring lines 27 is disposed in a gap between two FD through-wiring lines 26 adjacent to each other among the plurality of FD through-wiring lines 26. The second substrate 20 further includes, in the insulating layer 28, a plurality of FD junction electrodes 24 and a plurality of VSS junction electrodes 25. The plurality of FD junction electrodes 24 and the plurality of VSS junction electrodes 25 are both exposed on a surface of the insulating layer 28. The FD junction electrode 24 corresponds to a specific example of a "second junction electrode" of the present disclosure. The VSS junction electrode 25 corresponds to a specific example of a "fourth junction electrode" of the present disclosure. The plurality of FD junction electrodes 24 is provided one by one for each of the FD junction electrodes 17 of the first substrate 10. The FD junction electrode 24 is electrically coupled to the FD junction electrode 17. The FD junction electrode 24 and the FD junction electrode 17 include, for example, copper. The FD junction electrode 24 and the FD junction electrode 17 are disposed to be opposed to each other, and are joined to each other. The VSS junction electrode 25 is electrically coupled to the VSS junction electrode 18 of the first substrate 10. The VSS junction electrode 25 and the VSS junction electrode 18 include, for example, copper. The VSS junction electrode 25 and the VSS junction electrode 18 are disposed to be opposed to each other, and are joined to each other. Each of the VSS junction electrodes 25 is, for example, disposed in the same plane as each of the FD junction electrodes 24. The VSS junction electrode 25 is disposed in a gap between two FD junction electrodes 24 adjacent to each other among the plurality of FD junction electrodes 24. The sensor pixel 12 and the readout circuit 22 are electrically coupled to each other through junction of the FD junction electrodes 17 and 24.

The plurality of FD junction electrodes 24 and the plurality of FD through-wiring lines 26 are provided in the region opposed to the pixel region 13. The plurality of FD through-wiring lines 26 is provided one by one for each of the FD through-wiring lines 15. Each of the FD through-wiring lines 26 is coupled to the FD junction electrode 24 and the readout circuit 22 (specifically, the gate of the amplification transistor AMP). The plurality of VSS junction electrodes 25 and the plurality of VSS through-wiring lines 27 are provided in the region opposed to the pixel region 13. The plurality of VSS through-wiring lines 27 is provided one by one for each of the VSS through-wiring lines 16. Each of the VSS through-wiring lines 27 is coupled to the VSS junction electrode 25 and a region to which the reference potential VSS is to be applied in the second substrate 20 (a reference potential region of the readout circuit 22).

FIG. 5 illustrates a cross-sectional configuration example in a horizontal direction of the first substrate (A) and the second substrate (B). FIG. 5 illustrates an example of a layout of the FD junction electrodes 17 and the VSS junction electrodes 18 in a first substrate 100 and an example of a layout of the FD junction electrodes 24 and the VSS junction electrodes 25 in a second substrate 200. Each of the FD junction electrodes 17 and 24 is disposed, for example, to be offset in a column direction (a Y-axis direction) with respect to the floating diffusion FD in a plan view, as illustrated in (A) of FIG. 5, for example.

For example, in the present embodiment, the four sensor pixels 12 disposed in two rows×two columns share one readout circuit 22, and are further provided with one floating diffusion FD. The floating diffusion FD is provided substantially at a center of a region (a pixel unit U) including the four sensor pixels 12 disposed in two rows×two columns. The floating diffusion FD and the readout circuit 22 are disposed to overlap with each other. Meanwhile, each of the FD junction electrodes 17 and 24 is disposed to be offset in the Y-axis direction by about one pixel pitch from the center of the pixel unit U, for example. In such a configuration, each of the floating diffusions FD is alternately coupled to a corresponding one of the FD junction electrodes 17 disposed to be offset in an upward direction or a downward direction for each of the columns.

FIG. 6 schematically illustrates an example of a cross-sectional configuration in the vertical direction of the imaging device 1, corresponding to a line A-A' illustrated in FIG. 5. In a case where each of the FD junction electrodes 17 and 24 is disposed to be offset in the Y-axis direction by about one pixel pitch as described above, each of the floating diffusions FD provided substantially at the center of a corresponding one of the pixel units U is alternately coupled, for each of the columns, to a corresponding one of the FD junction electrodes 17 offset in the upward direction or the downward direction in a plan view, for example, through a via V2, a wiring layer M1, and a via V1, as illustrated in FIG. 6, for example. In addition, each of the FD junction electrodes 24 and the readout circuit 22 are electrically coupled to each other, for example, through a via V3, a wiring layer M2, and a via V4. In this structure, the via V2, the wiring layer M1, and the via V1 correspond to the FD through-wiring line 15 illustrated in FIG. 4, and the via V3, the wiring layer M2, and the via V4 correspond to the FD through-wiring line 26 illustrated in FIG. 4. For example, each of the FD junction electrodes 17 and 24 has a square shape, for example, rotated by substantially 45° with respect to the row direction (an X-axis direction) and the column direction (the Y-axis direction), for example.

FIG. 7 schematically illustrates an example of a cross-sectional configuration in the vertical direction of the imaging device 1, corresponding to a line B-B' illustrated in FIG. 5. Each of the VSS junction electrodes 18 or 25 is disposed in a gap between the two FD junction electrodes 17 or 24 adjacent to each other in a direction of substantially 45° with respect to the row direction (e.g., the X-axis direction) and the column direction (e.g., the Y-axis direction), as illustrated in FIG. 5, for example. Each of the VSS junction electrodes 18 or 25 is exposed on the surface of the insulating layer 19 or 28, and the VSS junction electrodes 18 and 25 are joined to each other, in a similar manner to each of the FD junction electrodes 17 and 24.

FIG. 8 illustrates an example of a wiring layout of the plurality of drive wiring lines 14 and the transfer transistors TR provided in the respective sensor pixels 12 in a horizontal plane of the imaging device 1. The imaging device 1 has a configuration in which the floating diffusions FD adjacent to each other in the row direction (the X-axis direction) are coupled to the respective FD junction electrodes 17 offset in the upward direction or the downward direction for each of the columns in a plan view, as illustrated in FIG. 5. FIG. 9 is a timing diagram illustrating reading of signal charge from the floating diffusions FD provided in the pixel units U of the imaging device 1 having the wiring layout illustrated in FIG. 8. Electric charge is read at different timings of the respective floating diffusions FD electrically coupled to respective ones of the plurality of FD junction electrodes 17 adjacent to each other in the row direction (and the plurality of FD junction electrodes 24 joined to the plurality of FD junction electrodes 17 on junction surfaces), as illustrated in FIG. 9.

A stack including the first substrate 10 and the second substrate 20 includes, in the region surrounding the pixel region 13, a plurality of through-wiring lines 42 penetrating the first substrate 10 and the second substrate 20. The plurality of through-wiring lines 42 is provided one by one for each of the drive wiring lines 14 of the first substrate 10. Each of the through-wiring lines 42 is coupled to the drive wiring line 14 and the vertical drive circuit 32*a* of the logic circuit 32. Therefore, the logic circuit 32 controls the sensor pixels 12 and the readout circuits 22 through the plurality of through-wiring lines 42. Each of the through-wiring lines 42 includes, for example, a TSV (Through Silicon Via). It is to be noted that, in place of each of the through-wiring lines 42, a through-wiring line penetrating the insulating layer 19 (hereinafter, referred to as a "through-wiring line a"), a through-wiring line penetrating the insulating layer 28 (hereinafter, referred to as a "through-wiring line b"), a junction electrode coupled to the through-wiring line a (hereinafter, referred to as a "junction electrode c"), and a junction electrode coupled to the through-wiring line b (hereinafter, referred to as a "junction electrode d") may be provided. At this time, the junction electrodes c and d include, for example, copper, and the junction electrode c and the junction electrode d are joined to each other.

The stack including the first substrate 10 and the second substrate 20 further includes, around the pixel region 13, the through-wiring line 43 and a through-wiring line 44, each of which penetrates the first substrate 10 and the second substrate 20. The through-wiring lines 43 and 44 include, for example, the TSV. The through-wiring line 43 is coupled to the booster circuit 33 of the third substrate 30 and has the power supply potential VDD. The power supply potential VDD is a value within a range of 2.5 V to 2.8 V, for example. The through-wiring line 44 is electrically coupled to a region to which the reference potential VSS is to be applied in the third substrate 30 (a reference potential region of the third substrate 30) and has the reference potential VSS. The reference potential VSS is, for example, zero volts.

The third substrate 30 is, for example, configured as a stack in which an insulating layer 36 is stacked on the semiconductor substrate 31. The third substrate 30 includes the insulating layer 36 as an interlayer insulating film. The insulating layer 36 is provided between the semiconductor substrate 31 and the second substrate 20. The semiconductor substrate 31 includes a silicon substrate. The third substrate 30 is configured in such a manner that the logic circuit 32 is provided at a portion on a side of a front surface of the semiconductor substrate 31 (the side of the second substrate 20). The third substrate 30 is bonded to the second substrate 20 with the front surface of the semiconductor substrate 31 directed toward a side of a back surface of the semiconductor substrate 21.

FIG. 10A illustrates an example of a wiring structure adapted to take out the output voltage Vout outputted from the logic circuit 32 from the imaging device 1. FIG. 10B illustrates an example of a wiring structure adapted to supply a reference potential to the booster circuit 33. FIG. 10C illustrates an example of a wiring structure adapted to supply the reference potential VSS to the third substrate 30. The stack including the first substrate 10 and the second substrate 20 includes, around the pixel region 13, openings 45*a*, 46*a*, and 47*a*, each of which penetrates the first substrate 10 and the second substrate 20. A coupling pad 45*b* is provided on a bottom surface of the opening 45*a*, and the coupling pad 45*b* is coupled to an output terminal of the logic circuit 32. For example, a bonding wire is coupled to the coupling pad 45*b*. A coupling pad 46*b* is provided on a bottom surface of the opening 46*a*, and the coupling pad 46*b* is coupled to the booster circuit 33. For example, a bonding wire is coupled to the coupling pad 46*b*. A coupling pad 47*b* is provided on a bottom surface of the opening 47*a*, and the coupling pad 47*b* is coupled to a region for which the reference potential VSS is to be applied in the third substrate 30. For example, a bonding wire is coupled to the coupling pad 47*b*.

It is to be noted that a through-wiring line 45*c* may be provided inside the opening 45*a*, as illustrated in FIG. 11A. In this case, for example, a coupling pad 45*d* may be provided on a front surface of the first substrate 10 corresponding to the through-wiring line 45*c*, and a bonding wire may be coupled to the coupling pad 45*d*. Further, a through-wiring line 46*c* may be provided inside the opening 46*a*, as illustrated in FIG. 11B. In this case, for example, a coupling pad 46*d* may be provided on the front surface of the first substrate 10 corresponding to the through-wiring line 46*c*, and a bonding wire may be coupled to the coupling pad 46*d*. In addition, a through-wiring line 47*c* may be provided inside the opening 47*a*, as illustrated in FIG. 11C. In this case, for example, a coupling pad 47*d* may be provided on the front surface of the first substrate 10 corresponding to the through-wiring line 47*c*, and a bonding wire may be coupled to the coupling pad 47*d*.

Workings and Effects

In the imaging device 1 of the present embodiment, the first substrate 10 and the second substrate 20 are electrically coupled to each other through the junction of the plurality of FD junction electrodes 17 and 24 formed on the respective junction surfaces. The first substrate 10 includes the plurality of sensor pixels 12 disposed in a matrix pattern, and the plurality of floating diffusions FD that each temporarily holds electric charge generated through photoelectric conversion in one or more of the sensor pixels 12. The second substrate 20 includes the plurality of readout circuits 22 that is provided one by one for every one or more of the sensor pixels 12 and outputs a pixel signal based on the electric charge outputted from the sensor pixels 12. The electric charge is read at different timings of the respective floating diffusions FD electrically coupled to respective ones of the plurality of FD junction electrodes 17 adjacent to each other in the row direction (and the plurality of FD junction electrodes 24 joined to the plurality of FD junction electrodes 17 on the junction surfaces). This increases a distance between the FD junction electrodes 17 or 24 electrically coupled to respective ones of the plurality of floating diffusions FD from which the signal electric charge is to be read at the same timing. A description is given below of this point.

Miniaturization of an area per pixel in the imaging device of a two-dimensional structure has been achieved through adoption of miniaturization processes and improvement in mounting density. In recent years, an imaging device of a three-dimensional structure has been developed to achieve a more compact imaging device and higher density of pixels. The imaging device of a three-dimensional structure includes, for example, two stacked semiconductor substrates including a photodiode, a circuit (a readout circuit) that reads electric charge obtained by the photodiode, a circuit (a control circuit) that controls reading of the electric charge from the photodiode, and the like. In a case where the area per pixel is miniaturized in the imaging device of a three-dimensional structure, an arrangement pitch between FD junction electrodes electrically coupling the two semiconductor substrates narrows, thereby increasing FD-FD coupling between the adjacent FD junction electrodes. This results in deterioration in image quality such as increase in white spots.

It is possible to suppress the increase in the FD-FD coupling between the adjacent FD junction electrodes, for example, by providing a shield junction electrode between the adjacent FD junction electrodes. However, this narrows an arrangement pitch between junction electrodes each including the FD junction electrode and the shield junction electrode. This results in an issue that the area per pixel is unable to be miniaturized.

In contrast, in the present embodiment, the plurality of FD junction electrodes 17 and 24 is disposed to be offset in the column direction by about one pixel pitch with respect to the plurality of floating diffusions FD in a plan view. The plurality of FD junction electrodes 17 and 24 is disposed in a matrix pattern on the respective junction surfaces of the first substrate 10 and the second substrate 20, and the plurality of floating diffusions FD is disposed in a matrix pattern in the first substrate 10. The floating diffusions FD adjacent to each other in the row direction are coupled to the respective FD junction electrodes 17 offset in the upward direction or the downward direction for each of the columns. This allows electric charge to be read at different timings of the respective floating diffusions FD electrically coupled to respective ones of the plurality of FD junction electrodes 17 adjacent to each other in the row direction (and the plurality of FD junction electrodes 24 joined to the plurality of FD junction electrodes 17 on the junction surfaces). This increases the distance between the FD junction electrodes 17 or 24 electrically coupled to the respective ones of the plurality of floating diffusions FD from which signal charge is to be read at the same timing.

Specifically, for example, a pitch between the FD junction electrodes in the imaging device in which the floating diffusions FD adjacent to each other in the row direction are to be read at the same timing is defined as 2*a*. In this case, the pitch between the FD junction electrodes 17 or 24 through which electric charge is to be read at the same timing in the imaging device 1 of the present embodiment satisfies √2×2a. In addition, the pitch between the junction electrodes each including the shield junction electrode provided between the adjacent FD junction electrodes is defined as a. In this case, the pitch between the junction electrodes in a case of including the VSS junction electrodes 18 or 25 in the imaging device 1 of the present embodiment satisfies √2×a. The VSS junction electrodes 18 or 25 function as shields that reduce signal interference between the FD junction electrodes 17 or 24 through which electric charge is to be read at the same timing.

As described above, in the imaging device 1 of the present embodiment, the signal interference caused by the FD-FD coupling is suppressed. This helps to miniaturize the area per pixel while suppressing the deterioration in the image quality.

Hereinafter, a description is given of Modification Examples 1 to 19, an application example, and practical application examples of the imaging device 1 according to the above-described embodiment. It is to be noted that the same reference signs are given to configurations common to the above-described embodiment in the following modification examples.

2. MODIFICATION EXAMPLES

2-1. Modification Example 1

FIG. 12 schematically illustrates another example of the cross-sectional configuration in the vertical direction of the imaging device 1, corresponding to the line B-B' illustrated in FIG. 5. The above-described embodiment indicates the example in which each of the VSS junction electrodes 18 or 25 is exposed on the surface of the insulating layer 19 or 28 and the VSS junction electrodes 18 and 25 are joined to each other; however, the present disclosure is not limited thereto.

For example, the VSS junction electrode 18 on a side of the first substrate 10 may be omitted to cause the via V1 to be exposed on the surface of the insulating layer 19, and the VSS junction electrode 25 and the via V3 on the side of the second substrate 20 may be omitted, as illustrated in FIG. 12. Even in such a configuration, it is possible to cause each of the VSS through-wiring lines 16 and 27 to function as a shield that reduces the signal interference between the FD through-wiring lines 15 adjacent to each other. This makes it possible to reduce the signal interference between the FD junction electrodes 17 or 24 adjacent to each other and between the FD through-wiring lines 15 or 26 coupled to the FD junction electrodes 17 or 24.

2-2. Modification Example 2

FIG. 13 schematically illustrates another example of the cross-sectional configuration in the vertical direction of the imaging device 1, corresponding to the line B-B' illustrated in FIG. 5. The above-described embodiment indicates the example in which each of the VSS junction electrodes 18 or 25 is exposed on the surface of the insulating layer 19 or 28 and the VSS junction electrodes 18 and 25 are joined to each other; however, the present disclosure is not limited thereto.

For example, the VSS junction electrode 25 and the via V3 on the side of the second substrate 20 may be omitted, as illustrated in FIG. 13. Even in such a configuration, it is possible to cause each of the VSS through-wiring lines 16 and 27 to function as a shield that reduces the signal interference between the FD through-wiring lines 15 adjacent to each other. This makes it possible to reduce the signal interference between the FD junction electrodes 17 or 24 adjacent to each other and between the FD through-wiring lines 15 or 26 coupled to the FD junction electrodes 17 or 24.

2-3. Modification Example 3

FIG. 14 schematically illustrates another example of the cross-sectional configuration in the vertical direction of the imaging device 1, corresponding to the line B-B' illustrated in FIG. 5. The above-described embodiment indicates the example in which each of the VSS junction electrodes 18 or 25 is exposed on the surface of the insulating layer 19 or 28 and the VSS junction electrodes 18 and 25 are joined to each other; however, the present disclosure is not limited thereto.

For example, the via V3 between the VSS junction electrode 25 and the wiring layer M2 on the side of the second substrate 20 may be omitted, as illustrated in FIG. 14. Even in such a configuration, it is possible to cause each of the VSS through-wiring lines 16 and 27 to function as a shield that reduces the signal interference between the FD through-wiring lines 15 adjacent to each other. This makes it possible to reduce the signal interference between the FD junction electrodes 17 or 24 adjacent to each other and between the FD through-wiring lines 15 or 26 coupled to the FD junction electrodes 17 or 24.

2-4. Modification Example 4

FIG. 15 illustrates a cross-sectional configuration example in the horizontal direction of the first substrate (A) and the second substrate (B). FIG. 15 illustrates another example of the layout of the FD junction electrodes 17 and the VSS junction electrodes 18 in the first substrate 100 and another example of the layout of the FD junction electrodes 24 and the VSS junction electrodes 25 in the second substrate 200. The above-described embodiment indicates the example in which the readout circuit 22 is disposed to overlap with the floating diffusion FD provided substantially at the center of the pixel unit U including the four sensor pixels 12 disposed in two rows×two columns; however, the present disclosure is not limited thereto.

For example, each of the FD junction electrodes 17 may be offset in the column direction (the Y-axis direction) on the side of the first substrate 10, and the substrate itself may be disposed to be offset in the Y-axis direction by about one pixel pitch on the side of the second substrate 20, as illustrated in FIG. 15. In this case, the wiring structure between the floating diffusion FD and the readout circuit 22, corresponding to the line A-A' illustrated in FIG. 15, has a structure in which the FD junction electrode 24, the via V3, the wiring layer M2, and the via V4 on the side of the second substrate 20 are stacked substantially linearly in the Y-axis direction, as illustrated in FIG. 16.

Accordingly, a length of the wiring lines that electrically couple the floating diffusion FD and the readout circuit 22 shortens as compared with the above-described embodiment. This makes it possible to reduce decrease in conversion efficiency, in addition to the effects of the above-described embodiment.

2-5. Modification Example 5

FIG. 17 illustrates a cross-sectional configuration example in the horizontal direction of the first substrate (A) and the second substrate (B). FIG. 17 illustrates another example of the layout of the FD junction electrodes 17 and the VSS junction electrodes 18 in the first substrate 100 and another example of the layout of the FD junction electrodes 24 and the VSS junction electrodes 25 in the second substrate 200. The above-described embodiment indicates the example in which the readout circuit 22 is disposed to overlap with the floating diffusion FD provided substantially at the center of the pixel unit U including the four sensor pixels 12 disposed in two rows×two columns; however, the present disclosure is not limited thereto.

For example, each of the FD junction electrodes 17 may not be offset on the side of the first substrate 10, and only each of the FD junction electrodes 24 on the side of the second substrate 20 may be offset by about one pixel pitch in the column direction (e.g., the Y-axis direction), as illustrated in FIG. 17. In this case, the wiring structure between the floating diffusion FD and the readout circuit 22, corresponding to the line A-A' illustrated in FIG. 17, has a structure in which the FD junction electrode 17, the via V1, the wiring layer M1, and the via V2 on the side of the first substrate 10 are stacked substantially linearly in the Y-axis direction, as illustrated in FIG. 18.

It is to be noted that the wiring layout of the plurality of drive wiring lines 14 and the transfer transistors TR provided in the respective sensor pixels 12 in the horizontal plane of the imaging device 1 of the present modification example is as illustrated in FIG. 19, for example.

Accordingly, the length of the wiring lines that electrically couple the floating diffusion FD and the readout circuit 22 shortens as compared with the above-described embodiment. This makes it possible to reduce the decrease in conversion efficiency, in addition to the effects of the above-described embodiment.

2-6. Modification Example 6

FIG. 20 illustrates a cross-sectional configuration example in the horizontal direction of the first substrate (A) and the second substrate (B). FIG. 20 illustrates another example of the layout of the FD junction electrodes 17 and the VSS junction electrodes 18 in the first substrate 100 and another example of the layout of the FD junction electrodes 24 and the VSS junction electrodes 25 in the second substrate 200. The above-described embodiment indicates the example in which the readout circuit 22 is disposed to overlap with the floating diffusion FD provided substantially at the center of the pixel unit U including the four sensor pixels 12 disposed in two rows×two columns; however, the present disclosure is not limited thereto.

For example, with the respective FD junction electrodes 17 and 24 on the side of the first substrate 10 and the side of the second substrate 20 being not offset, for example, the electric charge temporarily held in the respective floating diffusions FD adjacent to each other in the row direction (the X-axis direction) may be read as signal charge at different timings of the respective floating diffusions FD using the plurality of drive wiring lines 14, as illustrated in FIG. 20. In this case, the wiring structure between the floating diffusion FD and the readout circuit 22, corresponding to the line A-A' illustrated in FIG. 20, has a structure in which the FD junction electrode 17, the via V1, the wiring layer M1, and the via V2 on the side of the first substrate 10, and the FD junction electrode 24, the via V3, the wiring layer M2, and the via V4 on the side of the second substrate 20 are stacked substantially linearly in the Y-axis direction, as illustrated in FIG. 21.

Accordingly, the length of the wiring lines that electrically couple the floating diffusion FD and the readout circuit 22 further shortens as compared with the above-described embodiment and Modification Examples 4 and 5. This makes it possible to further reduce the decrease in conversion efficiency, in addition to the effects of the above-described embodiment.

2-7. Modification Example 7

The above-described embodiment indicates the example in which the respective floating diffusions FD adjacent to each other in the row direction (the X-axis direction) are shifted with respect to each other by one row in the column direction (the Y-axis direction), and the electric charge temporarily held in each of the floating diffusions FD is read as signal charge; however, the present disclosure is not limited thereto. The respective floating diffusions FD adjacent to each other in the row direction (the X-axis direction) may be shifted with respect to each other by two rows in the column direction (the Y-axis direction), and the electric charge temporarily held in each of the floating diffusions FD may be read as signal charge, as illustrated in FIG. 22, for example. FIG. 23 schematically illustrates an example of the cross-sectional configuration in the vertical direction of the imaging device illustrated in FIG. 22. In the present modification example, the FD through-wiring line 15 includes, for example, a via V5, a wiring layer M3, the via V2, the wiring layer M1 and the via V1, and the FD through-wiring line 26 includes, for example, the via V3, the wiring layer M2, the via V4, a wiring layer M4, and a via V6.

Accordingly, the distance between the FD junction electrodes 17 or 24, through which signal charge is to be read at the same timing, doubles as compared with the above-described embodiment. Therefore, it is possible to sufficiently reduce the signal interference without providing shield electrodes (the VSS junction electrodes 18 and 25).

2-8. Modification Example 8

The above-described embodiment indicates the example in which the FD junction electrodes 17 and 24 are offset by about one pixel pitch in the column direction (e.g., the Y-axis direction) using the wiring layers M1 and M2; however, the present disclosure is not limited thereto. For example, the FD junction electrodes 17 and 24 may be offset in the column direction (e.g., the Y-axis direction) using the vias V1 and V3 each having a large diameter, as illustrated in FIG. 24.

Accordingly, it is possible to reduce the number of wiring layers depending on the layout.

2-9. Modification Example 9

FIG. 25 illustrates a cross-sectional configuration example in the horizontal direction of the first substrate (A) and the second substrate (B). FIG. 25 illustrates another example of the layout of the FD junction electrodes 17 and the VSS junction electrodes 18 in the first substrate 100 and another example of the layout of the FD junction electrodes 24 and the VSS junction electrodes 25 in the second substrate 200. The above-described embodiment indicates the example in which each of the VSS junction electrodes 18 or 25 is disposed in a gap between the two FD junction electrodes 17 or 24 adjacent to each other in the direction of substantially 45° with respect to the row direction (the X-axis direction) and the column direction (the Y-axis direction). However, each of the VSS junction electrodes 18 and 25 may not necessarily be provided depending on a size of the sensor pixel.

Accordingly, it is possible to easily achieve the miniaturization of the area per pixel as compared with the above-described embodiment.

2-10. Modification Example 10

The above-described embodiment indicates the example in which four sensor pixels 12 disposed in two rows×two columns are set as one pixel unit U, and one floating diffusion FD is disposed substantially at the center thereof; however, the present disclosure is not limited thereto. For example, eight sensor pixels 12 disposed in four rows×two columns, for example, may be set as one pixel unit U, and the floating diffusions FD may be disposed, in the pixel unit U, one by one for every four sensor pixels 12 disposed in two rows×two columns, as illustrated in FIG. 26.

2-11. Modification Example 11

The above-described embodiment indicates the example in which four sensor pixels 12 disposed in two rows×two columns are set as one pixel unit U, and one floating diffusion FD is disposed substantially at the center thereof; however, the present disclosure is not limited thereto. For example, eight sensor pixels 12 disposed in two rows×four columns, for example, may be set as one pixel unit U, and the floating diffusions FD may be disposed, in the pixel unit U, one by one for every four sensor pixels 12 disposed in two rows×two columns, as illustrated in FIG. 27.

2-12. Modification Example 12

The above-described embodiment indicates the example in which four sensor pixels 12 disposed in two rows×two columns are set as one pixel unit U, and one floating diffusion FD is disposed substantially at the center thereof, however, the present disclosure is not limited thereto. For example, one floating diffusion FD may be disposed for one sensor pixel 12, as illustrated in FIG. 28.

2-13. Modification Example 13

The above-described embodiment indicates the example in which each of the FD junction electrodes 17 and 24 has a square shape, for example, rotated by substantially 45° with respect to the row direction (the X-axis direction) and the column direction (the Y-axis direction); however, the present disclosure is not limited thereto. For example, each of the FD junction electrodes 17 and 24 may have a square shape having sides that are parallel to the row direction (the X-axis direction) and the column direction (the Y-axis direction), as illustrated in FIG. 29.

Similarly, each of the VSS junction electrodes 18 and 25 may also have, for example, a square shape having sides that are parallel to the row direction (the X-axis direction) and the column direction (the Y-axis direction), as illustrated in FIG. 29.

2-14. Modification Example 14

The above-described embodiment indicates the example in which each of the FD junction electrodes 17 and 24 has a square shape, for example, rotated by substantially 45° with respect to the row direction (the X-axis direction) and the column direction (the Y-axis direction); however, the present disclosure is not limited thereto. For example, each of the FD junction electrodes 17 and 24 may have a polygonal shape such as an octagon as illustrated in FIG. 30, for example.

Similarly, each of the VSS junction electrodes 18 and 25 may also have, for example, a polygonal shape such as an octagon as illustrated in FIG. 30, for example.

2-15. Modification Example 15

The above-described embodiment indicates the example in which each of the FD junction electrodes 17 and 24, for example, has a square shape, for example, rotated by substantially 45° with respect to the row direction (the X-axis direction) and the column direction (the Y-axis direction); however, the present disclosure is not limited thereto. For example, each of the FD junction electrodes 17 and 24 may have a circular shape, as illustrated in FIG. 31, for example.

Similarly, each of the VSS junction electrodes 18 and 25 may also have, for example, a circular shape as illustrated in FIG. 31, for example.

2-16. Modification Example 16

FIG. 32 illustrates an example of a circuit configuration of the imaging device 1 according to any of the above-described embodiment or Modification Example 16 thereof. The imaging device 1 according to the present modification example is a CMOS image sensor incorporating a column parallel ADC.

The imaging device 1 according to the present modification example includes the vertical drive circuit 32*a*, the column signal processing circuit 32*b*, a reference voltage supplier 38, the horizontal drive circuit 32*c*, a horizontal output line 37, and the system control circuit 32*d*, in addition to the pixel region 13, as illustrated in FIG. 32. In the pixel region 13, the plurality of sensor pixels 12 including photoelectric conversion elements is disposed two-dimensionally in a matrix pattern (in a matrix shape).

In this system configuration, the system control circuit 32*d* generates, on the basis of a master clock MCK, clock signals, control signals, and the like adapted to serve as reference for an operation of the vertical drive circuit 32*a*, the column signal processing circuit 32*b*, the reference voltage supplier 38, the horizontal drive circuit 32*c*, and the like. The system control circuit 32*d* gives such signals to the vertical drive circuit 32*a*, the column signal processing circuit 32*b*, the reference voltage supplier 38, the horizontal drive circuit 32*c*, and the like.

Further, the vertical drive circuit 32*a* is formed in the first substrate 10 along with each of the sensor pixels 12 in the pixel region 13, and is also formed in the second substrate 20 including the readout circuit 22. The column signal processing circuit 32*b*, the reference voltage supplier 38, the horizontal drive circuit 32c, the horizontal output line 37, and the system control circuit 32d are formed in the third substrate 30.

For the sensor pixel 12, it is possible to use a configuration (not illustrated herein) including, for example, the transfer transistor TR that transfers, to the floating diffusion FD, electric charge obtained through photoelectric conversion performed by the photodiode PD, in addition to the photodiode PD. Further, for the readout circuit 22, it is possible to use, for example, a three-transistor configuration (not illustrated herein) including the reset transistor RST that controls a potential of the floating diffusion FD, the amplification transistor AMP that outputs a signal corresponding to the potential of the floating diffusion FD, and the selection transistor SEL that serves to perform pixel selection.

In the pixel region 13, the sensor pixels 12 are disposed two-dimensionally. In addition, the drive wiring line 14 is wired for each of the rows, and the vertical signal line VSL is wired for each of the columns, in this pixel arrangement having m rows and n columns. One end of each of the plurality of drive wiring lines 14 is coupled to each of output terminals corresponding to each of the rows of the vertical drive circuit 32a. The vertical drive circuit 32a includes a shift register or the like, and controls row addresses and row scanning of the pixel region 13 through the plurality of drive wiring lines 14.

The column signal processing circuit 32b includes, for example, ADCs (analog-to-digital conversion circuits) 35-1 to 35-m provided for respective pixel columns of the pixel region 13, i.e., for the respective vertical signal lines VSL. Each of the ADCs converts, into a digital signal, an analog signal outputted from each of the sensor pixels 12 in the pixel region 13 for each of the columns, and outputs the digital signal.

The reference voltage supplier 38 includes, for example, a DAC (a digital-to-analog conversion circuit) 38A as a section of generating a reference voltage Vref of a so-called ramp (RAMP) waveform whose level varies in a slope shape over time. It is to be noted that the section of generating the reference voltage Vref of the ramp waveform is not limited to the DAC 38A.

The DAC 38A generates the reference voltage Vref of the ramp waveform on the basis of a clock CK given from the system control circuit 32d under the control of a control signal CS1 given from the system control circuit 32d to supply the resulting voltage to the ADCs 35-1 to 35-m in the column signal processing circuit 32b.

It is to be noted that each of the ADCs 35-1 to 35-m is configured to selectively enable an AD conversion operation corresponding to each of operation modes including a normal frame rate mode and a high-speed frame rate mode. The normal frame rate mode is performed in a progressive scanning method of reading information concerning all the sensor pixels 12. The high-speed frame rate mode sets exposure time of the sensor pixels 12 to 1/N to raise a frame rate N times, for example, twice, as compared with the normal frame rate mode. Switching between these operation modes is performed under the control of control signals CS2 and CS3 given from the system control circuit 32d. Further, the system control circuit 32d is given, from an external system controller (not illustrated), information concerning instructions for switching between the respective operation modes, i.e., between the normal frame rate mode and the high-speed frame rate mode.

All the ADCs 35-1 to 35-m have the same configuration, and a description is given herein by citing the ADC 35-m as an example. The ADC 35-m includes a comparator 35A, an up/down counter (denoted as U/DCNT in the drawing) 35B as an example of a counting section, a transfer switch 35C, and a memory 35D.

The comparator 35A compares a signal voltage Vx of the vertical signal line VSL corresponding to a signal outputted from each of the sensor pixels 12 of an n-th column in the pixel region 13 with the reference voltage Vref of the ramp waveform supplied from the reference voltage supplier 38. For example, an output Vco is brought into an "H" level when the reference voltage Vref is greater than the signal voltage Vx, and the output Vco is brought into an "L" level when the reference voltage Vref is equal to or less than the signal voltage Vx.

The up/down counter 35B is an asynchronous counter. The clock CK is given from the system control circuit 32d to the up/down counter 35B simultaneously with the DAC 38A, under the control of the control signal CS2 given from the system control circuit 32d. In synchronization with the clock CK, the up/down counter 35B performs down (DOWN) count or up (UP) count, thereby measuring a comparation period of time from a start of a comparison operation by the comparator 35A until an end of the comparison operation.

Specifically, in the normal frame rate mode, the up/down counter 35B, in an operation of reading a signal from one sensor pixel 12, measures comparation time at the time of first reading by performing down count during a first operation of reading, and measures comparation time at the time of second reading by performing up count during a second operation of reading.

Meanwhile, in the high-speed frame rate mode, the up/down counter 35B holds a count result of the sensor pixels 12 of a certain row as it is, continues to measure, for the sensor pixels 12 of the next row, comparation time at the time of the first reading by performing down count from the previous count result during the first operation of reading, and measures comparation time at the time of the second reading by performing up count during the second operation of reading.

In the normal frame rate mode, the transfer switch 35C, under the control of the control signal CS3 given from the system control circuit 32d, is brought into an on (closed) state at the time of completion of a count operation by the up/down counter 35B for the sensor pixels 12 of a certain row to transfer to the memory 35D a count result of the up/down counter 35B.

Meanwhile, in the high-speed frame rate mode of, for example, N=2, the transfer switch 35C remains in an off (open) state at the time of the completion of the count operation by the up/down counter 35B for the sensor pixels 12 of a certain row, and is continuously brought into the on state at the time of the completion of the count operation by the up/down counter 35B for the sensor pixels 12 of the next row to transfer to the memory 35D a count result of two vertical pixels from the up/down counter 35B.

In such a manner, analog signals supplied, for each of the columns, from each of the sensor pixels 12 in the pixel region 13 through the vertical signal line VSL are converted into N-bit digital signals by each of the operations by the comparator 35A and the up/down counter 35B in each of the ADCs 35-1 to 35-m to be stored in the memory 35D.

The horizontal drive circuit 32c includes a shift register or the like, and controls column addresses and column scanning of the ADCs 35-1 to 35-m in the column signal processing circuit 32b. Under the control of the horizontal drive circuit 32c, the N-bit digital signals having been subjected to A/D conversion by each of the ADCs 35-1 to 35-*m* are sequentially read to the horizontal output line 37 to be outputted as imaging data through the horizontal output line 37.

It is to be noted that a circuit and the like that perform a variety of signal processing on the imaging data outputted through the horizontal output line 37 are not particularly illustrated because they are not directly related to the present disclosure; however, it is possible to provide such a circuit and the like in addition to the above-described components.

The imaging device 1 incorporating the column parallel ADC according to the present modification example of the above-described configuration allows the count result of the up/down counter 35B to be selectively transferred to the memory 35D through the transfer switch 35C. This makes it possible to independently control the count operation by the up/down counter 35B and the operation of reading the count result of the up/down counter 35B to the horizontal output line 37.

2-17. Modification Example 17

FIG. 33 illustrates a modification example of the sensor pixels 12 and the readout circuit 22. In Modification Examples 1 to 16 described above, the ADC may be provided for each of the floating diffusions FD, as illustrated in FIG. 33.

2-18. Modification Example 18

FIG. 34 illustrates a modification example of the sensor pixel 12 and the readout circuit 22. In Modification Examples 1 to 16 described above, the ADC may be provided for each of the sensor pixels 12, as illustrated in FIG. 34.

2-19. Modification Example 19

The above-described embodiment indicates the example of a so-called Cu—Cu junction of electrically joining the first substrate 10 and the second substrate 20 to each other, in which a front surface 11S1 of the semiconductor substrate 11 and a front surface 21S1 of the semiconductor substrate 21 are opposed to each other, and the FD junction electrodes 17 and 24 or the VSS junction electrodes 18 and 25 are joined to each other, as illustrated in FIG. 35, for example. However, the present disclosure is not limited thereto. For example, the front surface 11S1 of the semiconductor substrate 11 and a back surface 21S2 of the semiconductor substrate 21 may be opposed to each other, and the first substrate 10 and the second substrate 20 may be electrically coupled to each other using, for example, a through electrode TSV, as illustrated in FIG. 36.

Other Modification Examples

Further, two or more of these modification examples may be combined.

3. APPLICATION EXAMPLE

FIG. 37 illustrates an example of a schematic configuration of an imaging system 3 including the imaging device 1 according to any of the above-described embodiment or the modification examples thereof.

The imaging system 3 is, for example, an electronic apparatus including an imaging apparatus such as a digital still camera or a video camera, or a mobile terminal apparatus such as a smartphone or a tablet terminal. The imaging system 3 includes, for example, the imaging device 1 according to any of the above-described embodiment or the modification examples thereof, an optical system 141, a shutter device 142, a control circuit 143, a DSP circuit 144, a frame memory 145, a display 146, a storage 147, an operator 148, and a power supply unit 149. In the imaging system 3, the imaging device 1 according to any of the above-described embodiment or the modification examples thereof, the DSP circuit 144, the frame memory 145, the display 146, the storage 147, the operator 148, and the power supply unit 149 are coupled to each other through a bus line 150.

The optical system 141 includes one or more lenses, and guides light (incident light) from a subject to the imaging device 1 to form an image on a light-receiving surface of the imaging device 1. The shutter device 142 is disposed between the optical system 141 and the imaging device 1, and controls a period of irradiating the imaging device 1 with light and a period of blocking light into the imaging device 1 in accordance with control of the control circuit 143. The imaging device 1 accumulates signal charge for a predetermined period of time depending on light whose image is formed on the light-receiving surface through the optical system 141 and the shutter device 142. The signal charge accumulated in the imaging device 1 is transferred as image data in accordance with a drive signal (a timing signal) supplied from the control circuit 143. The control circuit 143 outputs the drive signal that controls a transfer operation of the imaging device 1 and a shutter operation of the shutter device 142 to drive the imaging device 1 and the shutter device 142.

The DSP circuit 144 is a signal processing circuit that processes the image data outputted from the imaging device 1. The frame memory 145 temporarily holds the image data processed by the DSP circuit 144 on a frame-by-frame basis. The display 146 includes, for example, a panel display unit such as a liquid crystal panel or an organic EL (Electro Luminescence) panel, and displays moving images or still images captured by the imaging device 1. The storage 147 records the image data of the moving images or still images captured by the imaging device 1 on a recording medium such as a semiconductor memory or a hard disk. The operator 148 issues operation commands for various functions of the imaging system 3 in accordance with an operation by a user. The power supply unit 149 supplies the imaging device 1, the DSP circuit 144, the frame memory 145, the display 146, the storage 147, and the operator 148 with various types of power as power for operating these supply targets as appropriate.

Next, a description is given of imaging steps in the imaging system 3.

FIG. 38 illustrates an example of a flowchart of an imaging operation in the imaging system 3. A user gives an instruction to start imaging by operating the operator 148 (step S101). Thereafter, the operator 148 transmits the imaging command to the control circuit 143 (step S102). Upon reception of the imaging command, the control circuit 143 starts control of the shutter device 142 and the imaging device 1. The imaging device 1 (specifically, the system control circuit 32*d*) performs imaging by a predetermined imaging method under the control of the control circuit 143 (step S103). The shutter device 142 controls a period of irradiating the imaging device 1 with light and a period of blocking light into the imaging device 1 under the control of the control circuit 143.

The imaging device 1 outputs image data obtained by imaging to the DSP circuit 144. Here, the image data refers to data for all pixels including pixel signals generated on the basis of electric charge held temporarily in the floating diffusions FD. The DSP circuit 144 performs predetermined signal processing (e.g., noise reduction processing) on the basis of the image data inputted from the imaging device 1 (step S104). The DSP circuit 144 causes the frame memory 145 to hold the image data having been subjected to the predetermined signal processing, and the frame memory 145 causes the storage 147 to store the image data (step S105). In such a manner, imaging in the imaging system 3 is performed.

In the present application example, the imaging device 1 according to any of the above-described embodiment or the modification examples thereof is applied to the imaging system 3. This allows the imaging device 1 to be made more compact, have a higher dynamic range, and have less noise, which makes it possible to provide the compact high-definition imaging system 3 having a wide dynamic range.

4. PRACTICAL APPLICATION EXAMPLES

Practical Application Example 1

A technique according to the present disclosure (the present technology) is applicable to various products. For example, the technique according to the present disclosure may be achieved as an apparatus to be mounted on any kind of a mobile body such as an automobile, an electric vehicle, a hybrid electric vehicle, a motorcycle, a bicycle, a personal mobility, an aircraft, a drone, a vessel, or a robot.

Figure 39:
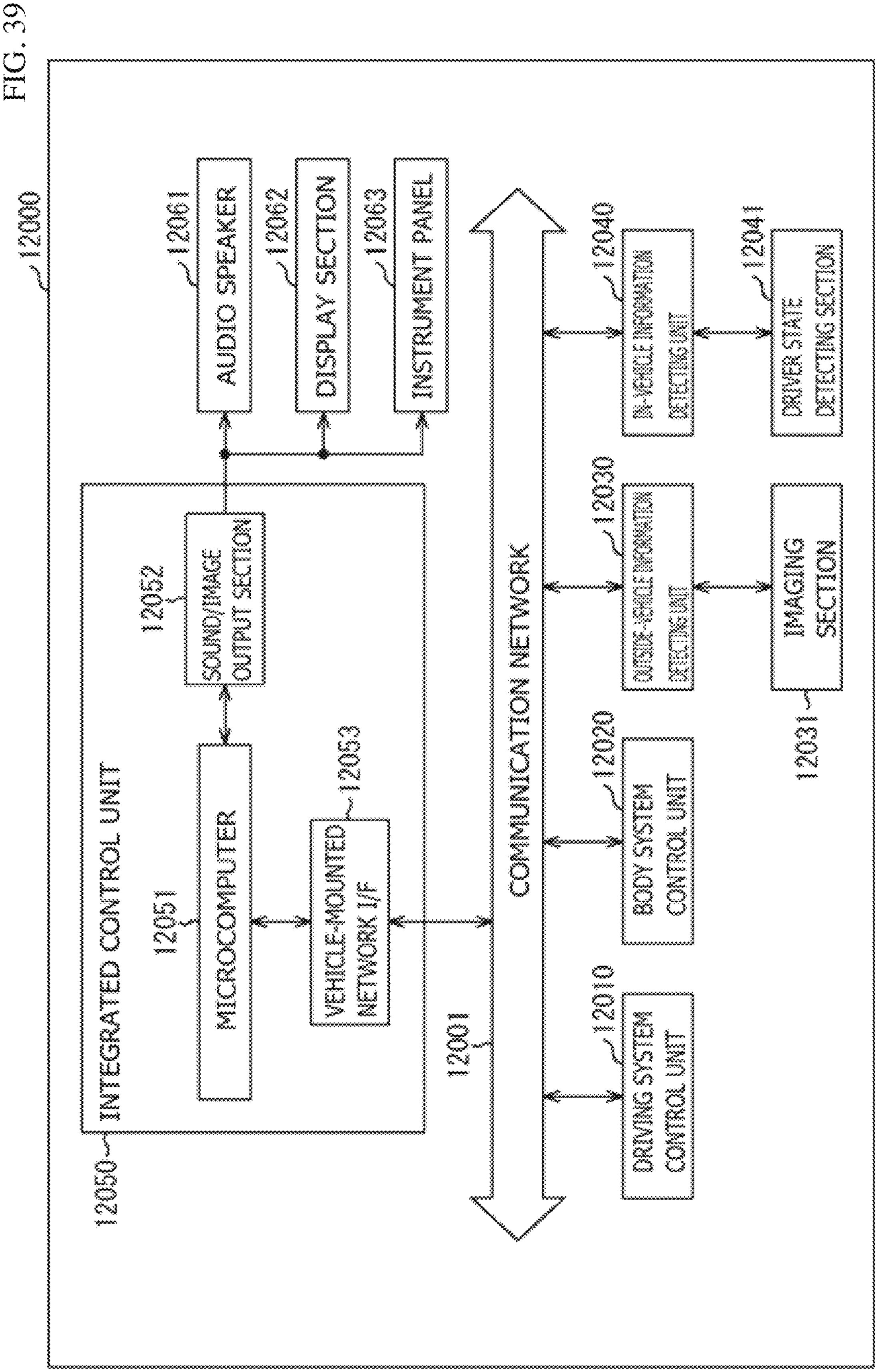
FIG. 39 is a block diagram depicting an example of schematic configuration of a vehicle control system.

FIG. 39 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 39, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 1021, an audio speaker 12061, a display section 12062, and an instrument panel 12063 are illustrated as the output device. The display section 12062 may, for example, include at least one of an on-board display and a head-up display.

Figure 40:
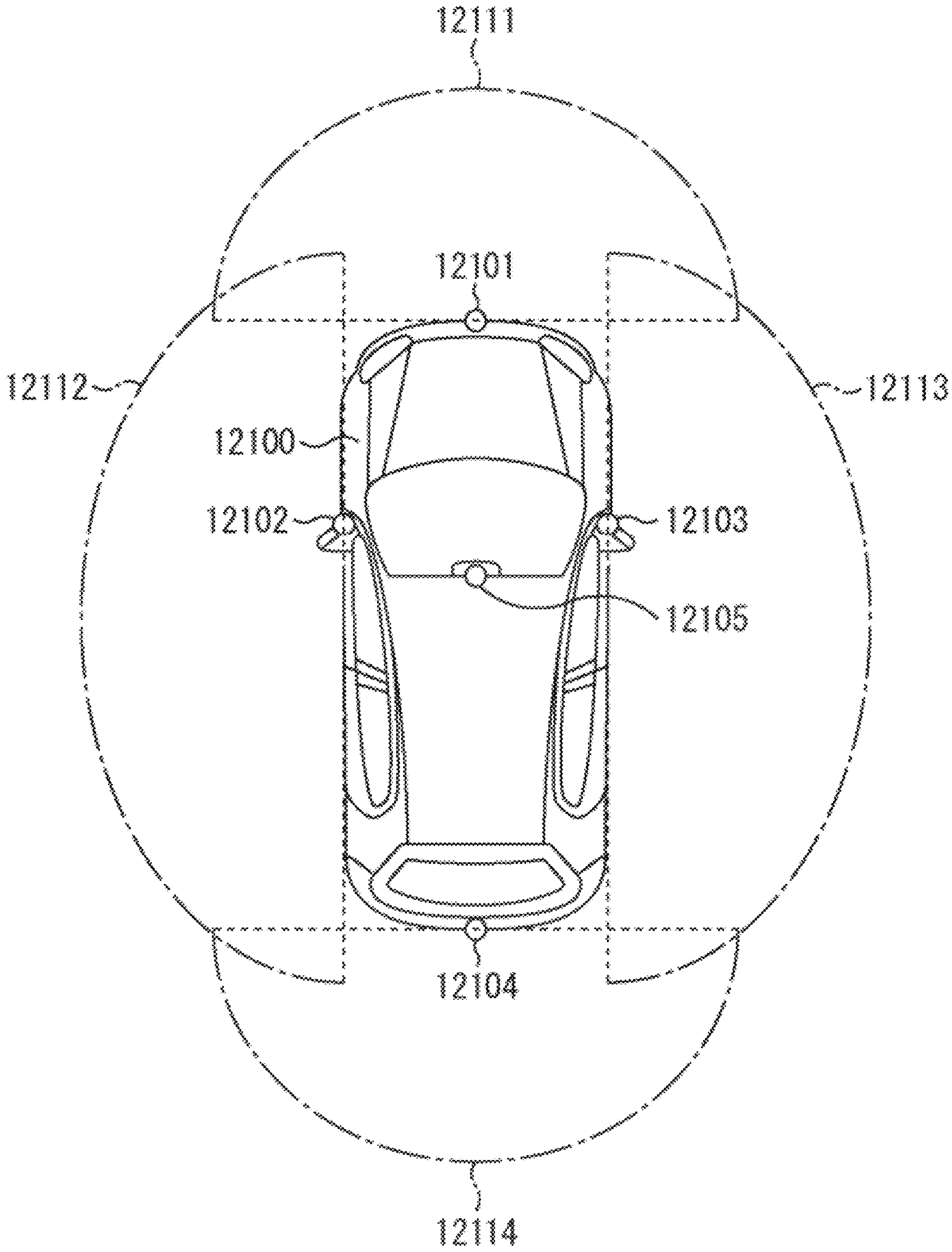
FIG. 40 is a diagram of assistance in explaining an example of installation positions of an outside-vehicle information detecting section and an imaging section.

FIG. 40 is a diagram depicting an example of the installation position of the imaging section 12031.

In FIG. 40, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 40 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

As described above, the description has been given of an example of the mobile body control system to which the technique according to the present disclosure may be applied. Of the configurations described above, the technique according to the present disclosure may be applied to the imaging section 12031. Specifically, the imaging device 1 according to any of the above-described embodiment or the modification examples thereof may be applied to the imaging section 12031. Applying the technique according to the present disclosure to the imaging section 12031 makes it possible to obtain a captured image with higher definition and less noise. This helps to perform highly accurate control by using the captured image in the mobile body control system.

Practical Application Example 2

Figure 41:
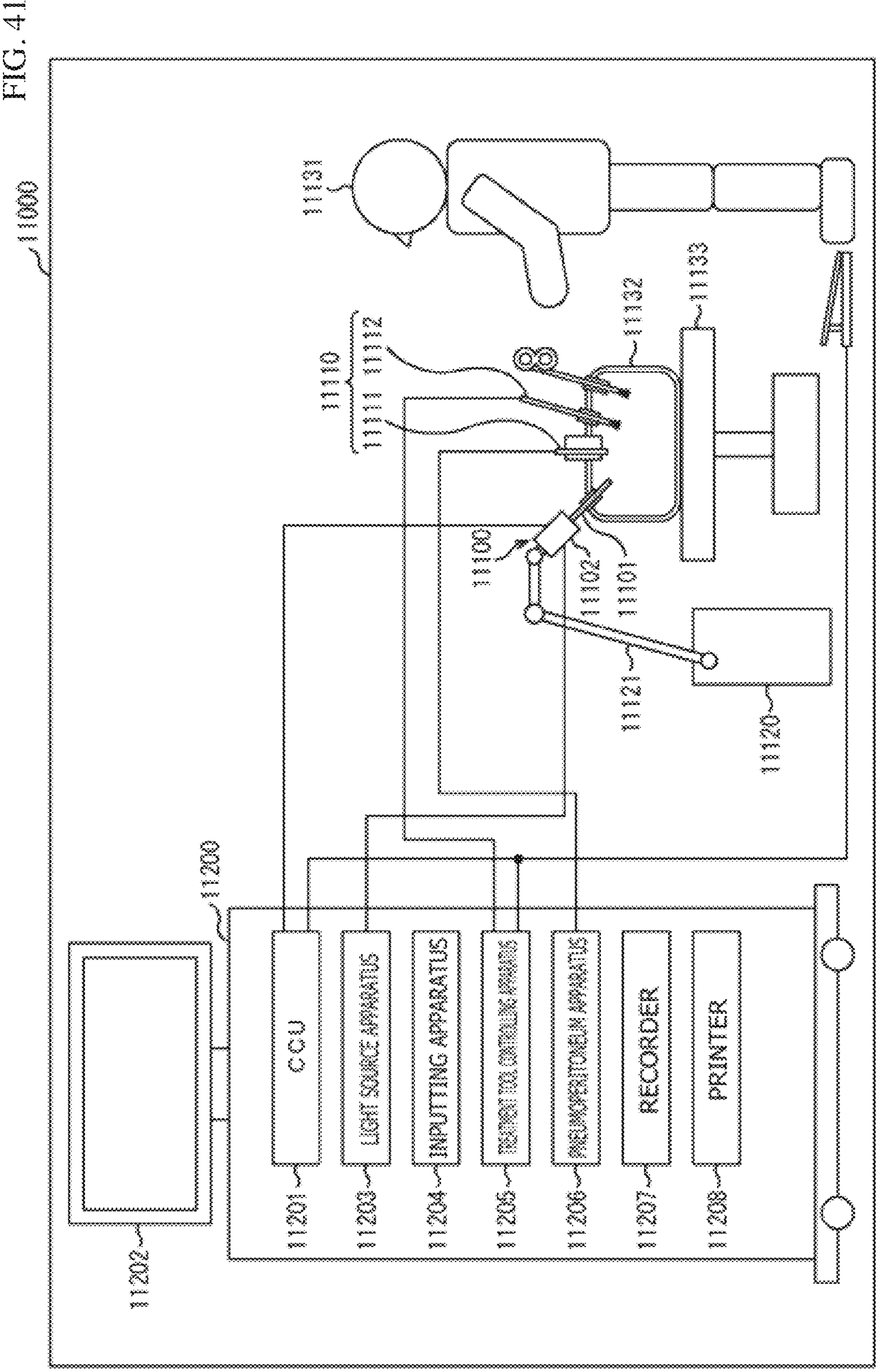
FIG. 41 is a view depicting an example of a schematic configuration of an endoscopic surgery system.

FIG. 41 is a view depicting an example of a schematic configuration of an endoscopic surgery system to which the technology according to an embodiment of the present disclosure (present technology) can be applied.

In FIG. 41, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 42 is a block diagram depicting an example of a functional configuration of the camera head 11102 and the CCU 11201 depicted in FIG. 41.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

As described above, the description has been given of an example of the endoscopic surgery system to which the technique according to the present disclosure may be applied. Of the configurations described above, the technique according to the present disclosure may be preferably applied to the image pickup unit 11402 provided in the camera head 11102 of the endoscope 11100. Applying the technique according to the present disclosure to the image pickup unit 11402 allows the image pickup unit 11402 to be made more compact or have higher definition. This helps to provide the compact or high-definition endoscope 11100.

The present disclosure has been described above with reference to the embodiment, Modification Examples 1 to 19 thereof, the application example, and the practical application examples; however, the present disclosure is not limited to the above-described embodiment and the like, and may be modified in a variety of ways. It is to be noted that the effects described herein are merely exemplary. The effects of the present disclosure are not limited to the effects described herein. The present disclosure may have any effects other than the effects described herein.

It is to be noted that the present technology may also have the following configuration. According to the present technology of the following configuration, a plurality of first junction electrodes electrically coupled to respective ones of the plurality of floating diffusion layers and a plurality of second junction electrodes coupled to respective ones of the plurality of first junction electrodes are provided on respective junction surfaces thereof, and electric charge temporarily held is read as signal charge at different timings of the respective ones of the plurality of floating diffusion layers electrically coupled to one of the first junction electrodes and one of the second junction electrodes that are joined to each other and to another one of the first junction electrodes and another one of the second junction electrodes that are joined to each other, the one of the first junction electrodes and the one of the second junction electrodes being adjacent to the other one of the first junction electrodes and the other one of the second junction electrodes in a row direction. This increases a distance between junction electrodes electrically coupled to the respective ones of the plurality of floating diffusion layers from which the signal charge is to be read at the same timing, helping to miniaturize a pixel while suppressing deterioration in image quality.

(1)

An imaging device including:

a first substrate including a pixel region, the pixel region including a plurality of sensor pixels and a plurality of floating diffusion layers, the plurality of sensor pixels being disposed in a matrix pattern and performing photoelectric conversion, the plurality of floating diffusion layers being disposed in a matrix pattern, being each provided for every one or more of the sensor pixels, and each temporarily holding electric charge generated through the photoelectric conversion in the one or more of the sensor pixels;

a second substrate including a plurality of readout circuits, the plurality of readout circuits being each provided for every one or more of the sensor pixels and outputting a pixel signal based on the electric charge outputted from the sensor pixels;

a plurality of first junction electrodes provided on a junction surface of the first substrate with the second substrate and electrically coupled to respective ones of the plurality of floating diffusion layers; and a plurality of second junction electrodes provided on a junction surface of the second substrate with the first substrate and joined to respective ones of the plurality of first junction electrodes, in which the first substrate and the second substrate are stacked on each other, and the electric charge temporarily held is read as signal charge at different timings of the respective ones of the plurality of floating diffusion layers electrically coupled to one of the first junction electrodes and one of the second junction electrodes that are joined to each other and to another one of the first junction electrodes and another one of the second junction electrodes that are joined to each other, the one of the first junction electrodes and the one of the second junction electrodes being adjacent to the other one of the first junction electrodes and the other one of the second junction electrodes in a row direction.

(2)

The imaging device according to (1), in which the plurality of first junction electrodes is provided in a matrix pattern on the junction surface with the second substrate, and the plurality of second junction electrodes is provided in a matrix pattern to be opposed to the plurality of first junction electrodes on the junction surface with the first substrate, and is electrically coupled to respective ones of the plurality of readout circuits.

(3)

The imaging device according to (2), in which the plurality of first junction electrodes is disposed to be alternately offset in an upward direction or a downward direction with respect to the plurality of floating diffusion layers electrically coupled to the respective ones of the plurality of first junction electrodes for each of columns in a plan view.

(4)

The imaging device according to (3), in which the plurality of second junction electrodes is disposed to be alternately offset in the upward direction or the downward direction with respect to the plurality of readout circuits electrically coupled to respective ones of the plurality of second junction electrodes for each of the columns in a plan view.

(5)

The imaging device according to (4), in which the plurality of first junction electrodes and the plurality of second junction electrodes are each disposed to be offset in a column direction by one or more pixel pitches with respect to a corresponding one of the plurality of floating diffusion layers.

(6)

The imaging device according to any one of (2) to (5), in which the plurality of floating diffusion layers, the plurality of readout circuits, the plurality of first junction electrodes, and the plurality of second junction electrodes that are electrically coupled to each other are disposed to substantially overlap with each other in a plan view, and the plurality of first junction electrodes and the plurality of second junction electrodes are each electrically coupled to a corresponding one of the plurality of floating diffusion layers and a corresponding one of the plurality of readout circuits through a wiring layer for each of columns, the plurality of floating diffusion layers and the plurality of readout circuits being disposed in an upward direction or a downward direction in a plan view.

(7)

The imaging device according to any one of (3) to (6), in which the plurality of second junction electrodes is disposed to substantially overlap with the readout circuits electrically coupled to respective ones of the plurality of second junction electrodes in a plan view.

(8)

The imaging device according to any one of (2) to (7), in which the plurality of first junction electrodes is disposed to substantially overlap with the plurality of floating diffusion layers electrically coupled to the respective ones of the plurality of first junction electrodes in a plan view.

(9)

The imaging device according to (8), in which the plurality of second junction electrodes is disposed to be alternately offset in an upward direction or a downward direction with respect to the plurality of readout circuits electrically coupled to respective ones of the plurality of second junction electrodes for each of columns in a plan view.

(10)

The imaging device according to any one of (2) to (9), in which the plurality of floating diffusion layers is each disposed for one of the sensor pixels.

(11)

The imaging device according to any one of (2) to (9), in which the plurality of floating diffusion layers is each disposed for four of the sensor pixels disposed in two rows by two columns.

(12)

The imaging device according to any one of (2) to (9), in which the plurality of floating diffusion layers is each disposed for eight of the sensor pixels disposed in two rows by four columns.

(13)

The imaging device according to any one of (1) to (12), in which the plurality of first junction electrodes and the plurality of second junction electrodes each have a square shape having sides parallel to the row direction and a column direction, or a square shape rotated by substantially 45 degrees with respect to the row direction and the column direction.

(14)

The imaging device according to any one of (1) to (12), in which the plurality of first junction electrodes and the plurality of second junction electrodes each have a polygonal shape or a circular shape.

(15)

The imaging device according to any one of (1) to (14), in which the first substrate and the second substrate further include a plurality of third junction electrodes and a plurality of fourth junction electrodes, respectively, the plurality of third junction electrodes and the plurality of fourth junction electrodes being fixed to a reference potential.

(16)

The imaging device according to (15), in which the plurality of third junction electrodes and the plurality of fourth junction electrodes each have a square shape having sides parallel to the row direction and a column direction, or a square shape rotated by substantially 45 degrees with respect to the row direction and the column direction.

(17)

The imaging device according to (15), in which the plurality of third junction electrodes and the plurality of fourth junction electrodes each have a polygonal shape or a circular shape.

(18)

The imaging device according to any one of (1) to (17), further including a third substrate including a control circuit that controls the sensor pixels and the readout circuits, in which the first substrate, the second substrate, and the third substrate are stacked in this order.

(19)

An imaging device including:

- a first substrate including a pixel region including a plurality of sensor pixels, the plurality of sensor pixels being disposed in a matrix pattern and performing photoelectric conversion;
- a second substrate stacked on the first substrate and including a plurality of readout circuits, the plurality of readout circuits being each provided for every one or more of the sensor pixels and outputting a pixel signal based on electric charge outputted from the sensor pixels;
- a plurality of floating diffusion layers disposed in a matrix pattern and each provided for every one or more of the sensor pixels in the first substrate, the plurality of floating diffusion layers each temporarily holding the electric charge generated through the photoelectric conversion in the one or more of the sensor pixels;
- a plurality of first junction electrodes provided in a matrix pattern on a junction surface of the first substrate with the second substrate and electrically coupled to respective ones of the plurality of floating diffusion layers; and
- a plurality of second junction electrodes provided in a matrix pattern to be opposed to the first junction electrodes on a junction surface of the second substrate with the first substrate, the plurality of second junction electrodes being electrically coupled to respective ones of the plurality of readout circuits, in which
- the plurality of first junction electrodes is disposed to be offset in a column direction with respect to the plurality of floating diffusion layers electrically coupled to respective ones of the plurality of first junction electrodes in a plan view, and
- the plurality of floating diffusion layers is alternately coupled to the plurality of first junction electrodes disposed to be offset in an upward direction or a downward direction for each of columns.

(20)

The imaging device according to (19), in which one of the floating diffusion layers coupled to one of the first junction electrodes and another one of the floating diffusion layers coupled to another one of the second junction electrodes are disposed in an oblique direction, the one of the floating diffusion layers and the other one of the floating diffusion layers being adjacent to each other in a row direction.

(21)

The imaging device according to (19) or (20), in which

- the plurality of floating diffusion layers and the plurality of readout circuits that are electrically coupled to each other through the plurality of first junction electrodes and the plurality of second junction electrodes are disposed to substantially overlap with each other in a plan view, and
- the plurality of second junction electrodes is disposed to be alternately offset in the upward direction or the downward direction with respect to the plurality of readout circuits electrically coupled to respective ones of the plurality of second junction electrodes for each of the columns in a plan view.

(22)

The imaging device according to (19) or (20), in which

- the plurality of readout circuits is disposed to be alternately offset in the upward direction or the downward direction with respect to the plurality of floating diffusion layers electrically coupled to the plurality of readout circuits through the plurality of first junction electrodes and the plurality of second junction electrodes for each of the columns in a plan view, and
- the plurality of second junction electrodes is disposed to substantially overlap with the plurality of readout circuits electrically coupled to respective ones of the plurality of second junction electrodes in a plan view.

(22)

An imaging device including:

a first substrate including a pixel region including a plurality of sensor pixels, the plurality of sensor pixels being disposed in a matrix pattern and performing photoelectric conversion;

a second substrate stacked on the first substrate and including a plurality of readout circuits, the plurality of readout circuits being each provided for every one or more of the sensor pixels and outputting a pixel signal based on electric charge outputted from the sensor pixels;

a plurality of floating diffusion layers disposed in a matrix pattern and each provided for every one or more of the sensor pixels in the first substrate, the plurality of floating diffusion layers each temporarily holding the electric charge generated through the photoelectric conversion in the one or more of the sensor pixels;

a plurality of first junction electrodes provided in a matrix pattern on a junction surface of the first substrate with the second substrate and electrically coupled to respective ones of the plurality of floating diffusion layers; and a plurality of second junction electrodes provided in a matrix pattern to be opposed to the first junction electrodes on a junction surface of the second substrate with the first substrate, the plurality of second junction electrodes being electrically coupled to respective ones of the plurality of readout circuits, in which the plurality of second junction electrodes is disposed to be offset in a column direction with respect to the plurality of readout circuits electrically coupled to respective ones of the plurality of second junction electrodes in a plan view, and the plurality of readout circuits is alternately coupled to the plurality of second junction electrodes disposed to be offset in an upward direction or a downward direction for each of columns.

(23)

The imaging device according to (22), in which the plurality of floating diffusion layers is disposed to be alternately offset in the upward direction or the downward direction with respect to the plurality of readout circuits electrically coupled to the plurality of floating diffusion layers through the plurality of first junction electrodes and the plurality of second junction electrodes for each of the columns in a plan view, and the plurality of first junction electrodes is disposed to substantially overlap with the plurality of floating diffusion layers electrically coupled to respective ones of the plurality of first junction electrodes in a plan view.

The present application claims the benefit of Japanese Priority Patent Application JP2021-201283 filed with the Japan Patent Office on Dec. 10, 2021, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. An imaging device comprising:

a first substrate including a pixel region, the pixel region including a plurality of sensor pixels and a plurality of floating diffusion layers, the plurality of sensor pixels being disposed in a matrix pattern and performing photoelectric conversion, the plurality of floating diffusion layers being disposed in a matrix pattern, being each provided for every one or more of the sensor pixels, and each temporarily holding electric charge generated through the photoelectric conversion in the one or more of the sensor pixels;

a second substrate including a plurality of readout circuits, the plurality of readout circuits being each provided for every one or more of the sensor pixels and outputting a pixel signal based on the electric charge outputted from the sensor pixels;

a plurality of first junction electrodes provided on a junction surface of the first substrate with the second substrate and electrically coupled to respective ones of the plurality of floating diffusion layers; and a plurality of second junction electrodes provided on a junction surface of the second substrate with the first substrate and joined to respective ones of the plurality of first junction electrodes, wherein the first substrate and the second substrate are stacked on each other, the electric charge temporarily held is read as signal charge at different timings of the respective ones of the plurality of floating diffusion layers electrically coupled to one of the first junction electrodes and one of the second junction electrodes that are joined to each other and to another one of the first junction electrodes and another one of the second junction electrodes that are joined to each other, the one of the first junction electrodes and the one of the second junction electrodes being adjacent to the other one of the first junction electrodes and the other one of the second junction electrodes in a row direction, the plurality of first junction electrodes is provided in a matrix pattern on the junction surface with the second substrate, the plurality of second junction electrodes is provided in a matrix pattern to be opposed to the plurality of first junction electrodes on the junction surface with the first substrate, and is electrically coupled to respective ones of the plurality of readout circuits, and the plurality of first junction electrodes is disposed to be alternately offset in an upward direction or a downward direction with respect to the plurality of floating diffusion layers electrically coupled to the respective ones of the plurality of first junction electrodes for each of columns in a plan view, such that first corresponding first junction electrodes are offset in the upward direction with respect to first corresponding floating diffusion layers in a first column, and second corresponding first junction electrodes are offset in the downward direction with respect to second corresponding floating diffusion layers in a second column adjacent to the first column.

2. The imaging device according to claim 1, wherein the plurality of second junction electrodes is disposed to be alternately offset in the upward direction or the downward direction with respect to the plurality of readout circuits electrically coupled to respective ones of the plurality of second junction electrodes for each of the columns in a plan view.

3. The imaging device according to claim 2, wherein the plurality of first junction electrodes and the plurality of second junction electrodes are each disposed to be offset in a column direction by one or more pixel pitches with respect to a corresponding one of the plurality of floating diffusion layers.

4. The imaging device according to claim 1, wherein the plurality of second junction electrodes is disposed to substantially overlap with the readout circuits electrically coupled to respective ones of the plurality of second junction electrodes in a plan view.

5. The imaging device according to claim 1, wherein the plurality of floating diffusion layers is each disposed for one of the sensor pixels.

6. The imaging device according to claim 1, wherein the plurality of floating diffusion layers is each disposed for four of the sensor pixels disposed in two rows by two columns.

7. The imaging device according to claim 1, wherein the plurality of floating diffusion layers is each disposed for eight of the sensor pixels disposed in two rows by four columns.

8. The imaging device according to claim 1, wherein the plurality of first junction electrodes and the plurality of second junction electrodes each have a square shape having sides parallel to the row direction and a column direction, or a square shape rotated by substantially 45 degrees with respect to the row direction and the column direction.

9. The imaging device according to claim 1, wherein the plurality of first junction electrodes and the plurality of second junction electrodes each have a polygonal shape or a circular shape.

10. The imaging device according to claim 1, wherein the first substrate and the second substrate further include a plurality of third junction electrodes and a plurality of fourth junction electrodes, respectively, the plurality of third junction electrodes and the plurality of fourth junction electrodes being fixed to a reference potential.

11. The imaging device according to claim 10, wherein the plurality of third junction electrodes and the plurality of fourth junction electrodes each have a square shape having sides parallel to the row direction and a column direction, or a square shape rotated by substantially 45 degrees with respect to the row direction and the column direction.

12. The imaging device according to claim 10, wherein the plurality of third junction electrodes and the plurality of fourth junction electrodes each have a polygonal shape or a circular shape.

13. The imaging device according to claim 1, further comprising a third substrate including a control circuit that controls the sensor pixels and the readout circuits, wherein the first substrate, the second substrate, and the third substrate are stacked in this order.

14. An imaging device comprising:

a first substrate including a pixel region, the pixel region including a plurality of sensor pixels and a plurality of floating diffusion layers, the plurality of sensor pixels being disposed in a matrix pattern and performing photoelectric conversion, the plurality of floating diffusion layers being disposed in a matrix pattern, being each provided for every one or more of the sensor pixels, and each temporarily holding electric charge generated through the photoelectric conversion in the one or more of the sensor pixels;

a second substrate including a plurality of readout circuits, the plurality of readout circuits being each provided for every one or more of the sensor pixels and outputting a pixel signal based on the electric charge outputted from the sensor pixels;

a plurality of first junction electrodes provided on a junction surface of the first substrate with the second substrate and electrically coupled to respective ones of the plurality of floating diffusion layers; and a plurality of second junction electrodes provided on a junction surface of the second substrate with the first substrate and joined to respective ones of the plurality of first junction electrodes, wherein the first substrate and the second substrate are stacked on each other, the electric charge temporarily held is read as signal charge at different timings of the respective ones of the plurality of floating diffusion layers electrically coupled to one of the first junction electrodes and one of the second junction electrodes that are joined to each other and to another one of the first junction electrodes and another one of the second junction electrodes that are joined to each other, the one of the first junction electrodes and the one of the second junction electrodes being adjacent to the other one of the first junction electrodes and the other one of the second junction electrodes in a row direction, the plurality of first junction electrodes is provided in a matrix pattern on the junction surface with the second substrate, the plurality of second junction electrodes is provided in a matrix pattern to be opposed to the plurality of first junction electrodes on the junction surface with the first substrate, and is electrically coupled to respective ones of the plurality of readout circuits, the plurality of floating diffusion layers, the plurality of readout circuits, the plurality of first junction electrodes, and the plurality of second junction electrodes that are electrically coupled to each other are disposed to substantially overlap with each other in a plan view, and the plurality of first junction electrodes and the plurality of second junction electrodes are each electrically coupled to a corresponding one of the plurality of floating diffusion layers and a corresponding one of the plurality of readout circuits through a wiring layer for each of columns, the plurality of floating diffusion layers and the plurality of readout circuits being disposed in an upward direction or a downward direction in a plan view, such that first corresponding readout circuits are offset in the upward direction with respect to first corresponding floating diffusion layers in a first column, and second corresponding readout circuits are offset in the downward direction with respect to second corresponding floating diffusion layers in a second column adjacent to the first column.

15. An imaging device comprising:

a first substrate including a pixel region, the pixel region including a plurality of sensor pixels and a plurality of floating diffusion layers, the plurality of sensor pixels being disposed in a matrix pattern and performing photoelectric conversion, the plurality of floating diffusion layers being disposed in a matrix pattern, being each provided for every one or more of the sensor pixels, and each temporarily holding electric charge generated through the photoelectric conversion in the one or more of the sensor pixels;

a second substrate including a plurality of readout circuits, the plurality of readout circuits being each provided for every one or more of the sensor pixels and outputting a pixel signal based on the electric charge outputted from the sensor pixels;

a plurality of first junction electrodes provided on a junction surface of the first substrate with the second substrate and electrically coupled to respective ones of the plurality of floating diffusion layers; and a plurality of second junction electrodes provided on a junction surface of the second substrate with the first substrate and joined to respective ones of the plurality of first junction electrodes, wherein the first substrate and the second substrate are stacked on each other, the electric charge temporarily held is read as signal charge at different timings of the respective ones of the plurality of floating diffusion layers electrically coupled to one of the first junction electrodes and one of the second junction electrodes that are joined to each other and to another one of the first junction electrodes and another one of the second junction electrodes that are joined to each other, the one of the first junction electrodes and the one of the second junction electrodes being adjacent to the other one of the first junction electrodes and the other one of the second junction electrodes in a row direction, the plurality of first junction electrodes is provided in a matrix pattern on the junction surface with the second substrate, the plurality of second junction electrodes is provided in a matrix pattern to be opposed to the plurality of first junction electrodes on the junction surface with the first substrate, and is electrically coupled to respective ones of the plurality of readout circuits, and the plurality of second junction electrodes is disposed to be alternately offset in an upward direction or a downward direction with respect to the plurality of readout circuits electrically coupled to respective ones of the plurality of second junction electrodes for each of columns in a plan view, such that first corresponding second junction electrodes are offset in the upward direction with respect to first corresponding readout circuits in a first column, and second corresponding second junction electrodes are offset in the downward direction with respect to second corresponding readout circuit in a second column adjacent to the first column.

* * * * *